US012802939B2

(12) United States Patent
Hasegawa et al.

(10) Patent No.: US 12,802,939 B2
(45) Date of Patent: Nov. 17, 2026

(54) METHOD OF CONTROLLING HIGH-FREQUENCY POWER SUPPLY SYSTEM

(71) Applicant: DAIHEN Corporation, Osaka (JP)

(72) Inventors: Yuichi Hasegawa, Osaka (JP); Yuya Ueno, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 19/238,672

(22) Filed: Jun. 16, 2025

(65) Prior Publication Data

US 2026/0004995 A1 Jan. 1, 2026

(30) Foreign Application Priority Data

Jun. 28, 2024 (JP) ................................ 2024-105762

(51) Int. Cl.
*H01J 37/32* (2006.01)

(52) U.S. Cl.
CPC .. *H01J 37/32183* (2013.01); *H01J 37/32146* (2013.01); *H01J 37/32165* (2013.01)

(58) Field of Classification Search
CPC ........... H01J 37/32183; H01J 37/32146; H01J 37/321695; H01J 37/32128; H01J 37/32174
See application file for complete search history.

(56) References Cited

U.S. PATENT DOCUMENTS

| | | | | |
|---|---|---|---|---|
| 10,115,567 B2 * | 10/2018 | Hirano | H01J 37/32183 |
| 10,304,669 B1 | 5/2019 | Coumou et al. | |
| 12,640,345 B2 * | 5/2026 | Hasegawa | H01J 37/32165 |
| 2010/0194195 A1 * | 8/2010 | Coumou | H01J 37/32174 307/24 |
| 2013/0213573 A1 | 8/2013 | Valcore, Jr. et al. | |
| 2013/0213934 A1 | 8/2013 | Valcore, Jr. et al. | |
| 2013/0214682 A1 | 8/2013 | Valcore, Jr. et al. | |
| 2013/0214683 A1 | 8/2013 | Valcore, Jr. et al. | |
| 2013/0214828 A1 | 8/2013 | Valcore, Jr. et al. | |
| 2014/0009073 A1 | 1/2014 | Valcore, Jr. et al. | |

(Continued)

FOREIGN PATENT DOCUMENTS

| | | |
|---|---|---|
| JP | 2017-188434 A | 10/2017 |
| JP | 6312405 B2 | 4/2018 |

(Continued)

*Primary Examiner* — Raymond R Chai
(74) *Attorney, Agent, or Firm* — Rimon P.C.

(57) ABSTRACT

A high-frequency power supply system according to the present disclosure includes a first power supply, a second power supply, and a first matcher. The first power supply performs frequency modulation control in a second power supply ON period and performs frequency offset control to output a forward wave voltage VF3 having a fundamental frequency F3 obtained by adding an offset frequency to a fundamental frequency F1 in a second power supply OFF period. An optimum value of an initial phase α of a modulation signal is searched for, and an offset frequency Fos at which a difference between a reflection coefficient ρ11 or load-side impedance Z11 corresponding to a center of a locus and a reflection coefficient ρ12 or load-side impedance Z12 is minimum is searched for, and the fundamental frequency F3 in the second power supply OFF period is set.

4 Claims, 15 Drawing Sheets

(56) References Cited

U.S. PATENT DOCUMENTS

2014/0167613 A1 6/2014 Fong et al.
2014/0172335 A1 6/2014 Valcore, Jr. et al.
2014/0195033 A1 7/2014 Lyndaker et al.
2014/0210508 A1 7/2014 Valcore, Jr. et al.
2014/0214350 A1 7/2014 Valcore, Jr. et al.
2014/0214351 A1 7/2014 Valcore, Jr. et al.
2014/0214395 A1 7/2014 Valcore, Jr. et al.
2014/0265852 A1 9/2014 Valcore, Jr.
2014/0305589 A1 10/2014 Valcore, Jr.
2015/0048740 A1 2/2015 Valcore, Jr. et al.
2015/0069912 A1 3/2015 Valcore, Jr. et al.
2015/0091440 A1 4/2015 Marakhtanov et al.
2015/0091441 A1 4/2015 Marakhtanov et al.
2015/0122420 A1 5/2015 Konno et al.
2015/0122421 A1* 5/2015 Konno .............. H01J 37/32183 156/345.28
2015/0214012 A1 7/2015 Valcore, Jr. et al.
2015/0311041 A1 10/2015 Valcore, Jr. et al.
2016/0005573 A1 1/2016 Valcore, Jr. et al.
2016/0044775 A1 2/2016 Valcore, Jr. et al.
2016/0079037 A1* 3/2016 Hirano .............. H01J 37/32183 156/345.28
2016/0172162 A1 6/2016 Fong et al.
2016/0189937 A1 6/2016 Valcore, Jr. et al.
2016/0233058 A1 8/2016 Marakhtanov et al.
2016/0240356 A1 8/2016 Howald et al.
2016/0259872 A1 9/2016 Howald et al.
2016/0268100 A1 9/2016 Valcore, Jr. et al.
2016/0276137 A1 9/2016 Valcore, Jr. et al.
2016/0307736 A1 10/2016 Howald et al.
2016/0307738 A1 10/2016 Marakhtanov et al.
2016/0308560 A1 10/2016 Howald et al.
2016/0322207 A1 11/2016 Howald et al.
2016/0336152 A1 11/2016 Valcore, Jr. et al.
2016/0343548 A1 11/2016 Howald et al.
2017/0032945 A1 2/2017 Valcore, Jr. et al.
2017/0062187 A1 3/2017 Radomski et al.
2017/0084432 A1 3/2017 Valcore, Jr. et al.
2017/0103872 A1 4/2017 Howald et al.
2017/0178864 A1 6/2017 Valcore, Jr. et al.
2017/0178873 A1 6/2017 Valcore, Jr. et al.
2017/0194130 A1 7/2017 Lyndaker et al.
2017/0294293 A1 10/2017 Howald et al.
2017/0330732 A1 11/2017 Valcore, Jr. et al.
2018/0018418 A1 1/2018 Valcore, Jr. et al.
2018/0033596 A1 2/2018 Valcore, Jr. et al.
2018/0053632 A1 2/2018 Fong et al.
2018/0068834 A1 3/2018 Valcore, Jr. et al.
2018/0294140 A1 10/2018 Valcore, Jr. et al.
2018/0323038 A1 11/2018 Valcore, Jr. et al.
2019/0057847 A1 2/2019 Valcore, Jr. et al.
2019/0272306 A1 9/2019 Howald et al.
2019/0318919 A1 10/2019 Lyndaker et al.
2020/0067545 A1 2/2020 Howald et al.
2020/0074034 A1 3/2020 Valcore, Jr. et al.
2020/0185196 A1* 6/2020 Ye ..................... H01J 37/32183
2020/0203129 A1* 6/2020 Koshimizu ....... H01J 37/32091
2020/0218774 A1 7/2020 Howald et al.
2020/0243304 A1 7/2020 Valcore, Jr. et al.
2022/0208519 A1 6/2022 Hasegawa et al.
2022/0277934 A1 9/2022 Valcore, Jr. et al.
2024/0021408 A1 1/2024 Valcore, Jr. et al.

FOREIGN PATENT DOCUMENTS

JP 2018-536295 A 12/2018
JP 2022-102688 A 7/2022

* cited by examiner

METHOD OF CONTROLLING HIGH-FREQUENCY POWER SUPPLY SYSTEM

CROSS-REFERENCE TO RELATED APPLICATIONS

This application is based upon and claims the benefit of priority from Japanese Patent Application No. 2024-105762, filed on Jun. 28, 2024, the entire contents of which are incorporated herein by reference.

FIELD

The present disclosure relates to a method of controlling a high-frequency power supply system.

BACKGROUND

For example, a high-frequency power supply system used in a plasma processing apparatus includes two high-frequency power supplies (first power supply and second power supply), and outputs high-frequency voltages (forward wave voltages) having different fundamental frequencies (frequencies of fundamental waves) from the respective power supplies toward a load. For example, the first power supply outputs a high-frequency voltage (forward wave voltage VF1) having a fundamental frequency F1 suitable for plasma generation to supply high-frequency power (first forward wave power) to the load. The second power supply outputs a high-frequency voltage (forward wave voltage VF2) having a fundamental frequency F2 (fundamental frequency F1>fundamental frequency F2) suitable for ion acceleration to supply high-frequency power (second forward wave power) to the load. (See JP 2018-536295 A, JP 2017-188434 A, and U.S. Pat. No. 10,304,669).

In addition, a first matcher is provided between the first power supply and the load, and impedance matching on the first power supply side is performed by adjusting a value (for example, the capacitance value of a variable capacitor) of an internal variable element such that a power value of reflected wave power at an output end (input end of the first matcher) of the first power supply decreases. Moreover, a second matcher is provided between the second power supply and the load, and impedance matching on the second power supply side is performed by adjusting a value (for example, the capacitance value of a variable capacitor) of an internal variable element such that a power value of reflected wave power at an output end (input end of the second matcher) of the second power supply decreases.

In the above configuration, intermodulation distortion (IMD) occurs. As a result, a phenomenon occurs in which the reflected wave power fluctuates according to the cycle of the fundamental frequency F2 on the first power supply side. In order to reduce the power value of the reflected wave power caused by the IMD, a technique for performing frequency modulation control on the first power supply is known.

However, this technique is a technique for reducing the power value of the reflected wave power when the IMD occurs. Therefore, when the first power supply outputs the forward wave voltage VF1, the power value of the reflected wave power cannot be sufficiently reduced in a case where the second power supply performs pulse modulation in which the ON operation of outputting the forward wave voltage VF2 and the OFF operation of not outputting the forward wave voltage VF2 are repeated. That is, because the IMD occurs during the second power supply ON period in which the second power supply performs the ON operation, the power value of the reflected wave power can be reduced by performing the frequency modulation control. However, in the second power supply OFF period in which the second power supply performs the OFF operation, the IMD does not occur because the forward wave voltage VF2 is not output. Therefore, when the output of the first power supply is frequency-modulated even during the second power supply OFF period, the power value of the reflected wave power is rather increased.

In addition, because the output state of the second power supply is greatly different between the second power supply ON period and the second power supply OFF period, the power value of the reflected wave power on the first power supply side cannot be reduced only by the matching operation of the first matcher in both periods: the second power supply ON period and the second power supply OFF period. This is because the time required for the matching operation of the first matcher is longer than the cycle time of the pulse modulation.

In addition, in a case where the first power supply performs the frequency modulation control, it is necessary to determine an optimum value (the value in which the power value of the reflected wave power is minimized) of the initial phase and the frequency shift used in a modulation signal in advance, but, the initial phase and the frequency shift used in the modulation signal may not properly be determined because the matching operation of the first matcher gives an adverse effect. As a result, even when the frequency modulation control is performed in the second power supply ON period, the power value of the reflected wave power may not be sufficiently reduced.

SUMMARY

A method of controlling a high-frequency power supply system according to the present disclosure, the high-frequency power supply system including: a second power supply that is capable of outputting a second forward wave voltage having a second fundamental frequency lower than a predetermined first fundamental frequency, and performs pulse modulation of repeating an ON operation of outputting the second forward wave voltage and an OFF operation of not outputting the second forward wave voltage; a first power supply that is capable of outputting a first forward wave voltage having the first fundamental frequency, and performs frequency modulation control to frequency-modulate the first forward wave voltage with a modulation signal having a same frequency as the second fundamental frequency in a second power supply ON period in which the ON operation is performed, and performs frequency offset control to output a third forward wave voltage having a third fundamental frequency obtained by adding an offset frequency to the first fundamental frequency in a second power supply OFF period in which the OFF operation is performed; and a first matcher that is connected between the first power supply and a load and performs a first matching operation of matching an impedance on a first power supply side with an impedance on a load side, includes: causing the first matcher to perform the first matching operation after power supply from the first power supply and the second power supply to the load is started, and stopping the first matching operation when the first matching operation is completed; searching for an initial phase of the modulation signal in which a reflection coefficient or load-side impedance at an output end of the first power supply calculated in the second power supply ON period is optimum within a search range in a state where the first matching operation in the first matcher is stopped; searching for a frequency shift or a frequency shift gain in which the reflection coefficient or the load-side impedance at the output end of the first power supply calculated in the second power supply ON period is optimum within the search range in the state where the first matching operation in the first matcher is stopped; and searching for an offset frequency at which a reflection coefficient or load-side impedance at the output end of the first power supply calculated in the second power supply OFF period is optimum within the search range in the state where the first matching operation in the first matcher is stopped. The initial phase of the modulation signal for optimization within the search range is an initial phase in which an average value of absolute values of differences between an average value of reflection coefficients or load-side impedances at the output end of the first power supply acquired for initial phases to be searched for and instantaneous values of the reflection coefficients or the load-side impedances at the output end of the first power supply acquired for the initial phases to be searched for is minimum, or an initial phase of the modulation signal in which a reflection coefficient absolute value or a power value of reflected wave power at the output end of the first power supply calculated in the second power supply ON period is minimum within the search range. The frequency shift or frequency shift gain for optimization within the search range is a frequency shift or a frequency shift gain in which an average value of absolute values of differences between an average value of the reflection coefficients or the load-side impedances at the output end of the first power supply acquired for frequency shifts to be searched for and instantaneous values of the reflection coefficients or the load-side impedances at the output end of the first power supply acquired for the frequency shifts to be searched for is minimum, or a frequency shift or a frequency shift gain in which a reflection coefficient absolute value or a power value of reflected wave power at the output end of the first power supply calculated in the second power supply ON period is minimum within the search range. An offset frequency value for optimization within the search range is an offset frequency at which a difference between an average value of reflection coefficients or load-side impedances at the output end of the first power supply calculated in the second power supply ON period and an average value of reflection coefficients or load-side impedances at the output end of the first power supply calculated in the second power supply OFF period is minimum in a state where the initial phase for the optimization is set as an initial phase and the frequency shift or the frequency shift gain for the optimization is set.

DETAILED DESCRIPTION

Hereinafter, an embodiment of a high-frequency power supply system 90 according to the present disclosure will be described with reference to the accompanying drawings.

Figure 1:
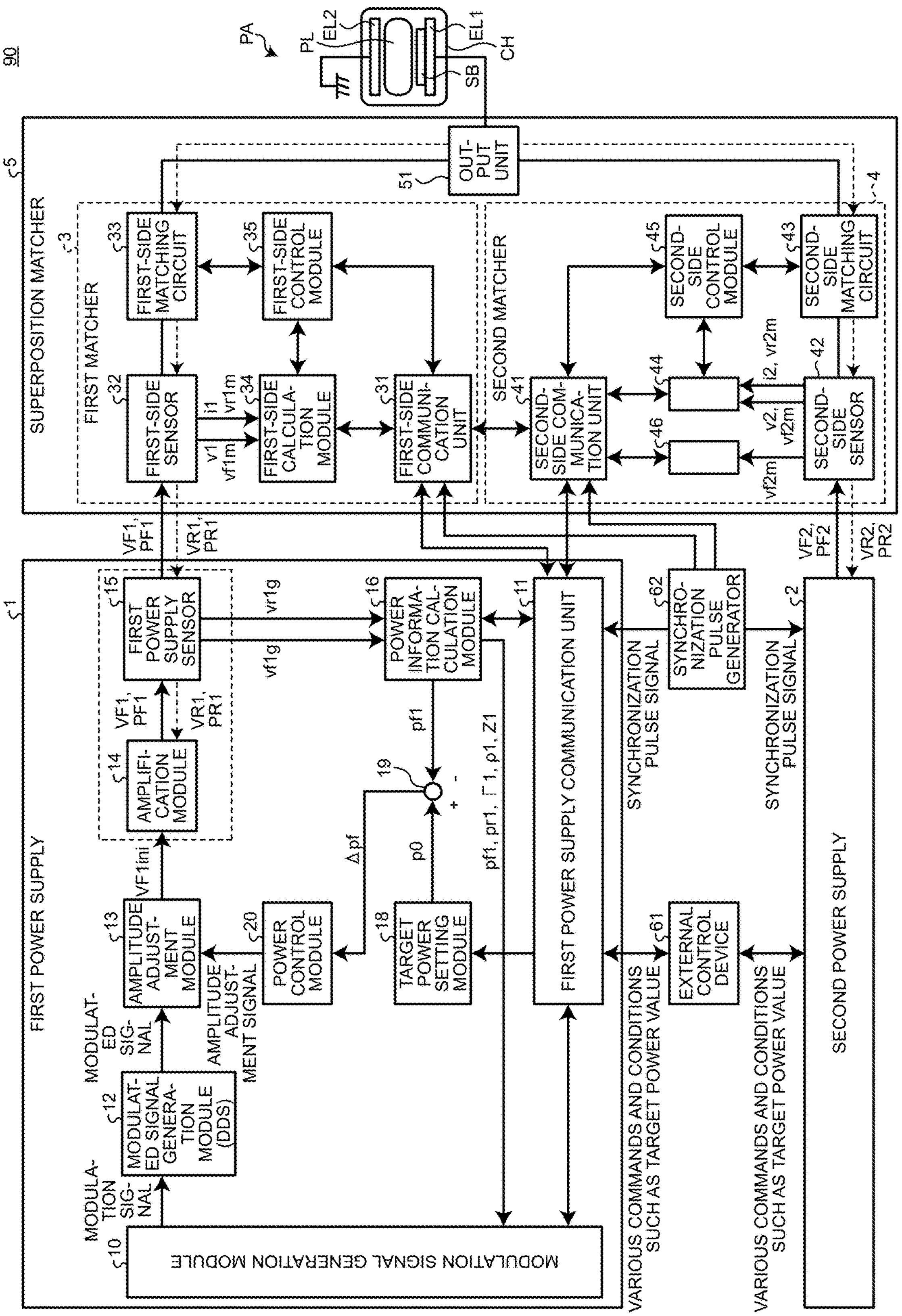
FIG. 1 is a diagram illustrating a configuration of a high-frequency power supply system.

FIG. 1 is a diagram illustrating a configuration of the high-frequency power supply system 90. The high-frequency power supply system 90 is a device that supplies high-frequency power to a load (for example, a plasma processing apparatus PA) by outputting a high-frequency voltage having a frequency in a radio frequency (RF) band.

Such a high-frequency power supply system 90 includes, for example, a first power supply 1, a second power supply 2, and a superposition matcher 5. In addition, the superposition matcher 5 includes a first matcher 3, a second matcher 4, and an output unit 51. Then, high-frequency voltages having different fundamental frequencies (frequencies of fundamental waves) are output from the first power supply 1 and the second power supply 2 toward the load.

Note that, in the present specification, the fundamental frequency of the first power supply 1 is referred to as the fundamental frequency F1 (an example of a first fundamental frequency), the fundamental frequency of the second power supply 2 is referred to as the fundamental frequency F2 (an example of a second fundamental frequency), and a frequency obtained by adding an offset frequency Fos to the fundamental frequency F1 is referred to as a fundamental frequency F3 (an example of a third fundamental frequency).

In addition, a high-frequency voltage output from the first power supply 1 to the load is referred to as a forward wave voltage VF1 (an example of a first forward wave voltage), a high-frequency voltage reflected from the load side and returned to the first power supply 1 is referred to as a reflected wave voltage VR1, high-frequency power output from the first power supply 1 to the load is referred to as forward wave power PF1, and high-frequency power reflected from the load side and returned to the first power supply 1 is referred to as reflected wave power PR1.

In addition, a high-frequency voltage output from the second power supply 2 to the load is referred to as a forward wave voltage VF2 (an example of a second forward wave voltage), a high-frequency voltage reflected from the load side and returned to the second power supply 2 is referred to as a reflected wave voltage VR2, high-frequency power output from the second power supply 2 to the load is referred to as forward wave power PF2, and high-frequency power reflected from the load side and returned to the second power supply 2 is referred to as reflected wave power PR2.

In addition, the power value of the forward wave power PF1 is referred to as a forward wave power value pf1, the power value of the reflected wave power PR1 is referred to as a reflected wave power value pr1, the power value obtained by subtracting the reflected wave power value pr1 from the forward wave power value pf1 is referred to as a load-side power value pl1 (not illustrated), the power value of the forward wave power PF2 is referred to as a forward wave power value pf2, the power value of the reflected wave power PR2 is referred to as a reflected wave power value pr2, and the power value obtained by subtracting the reflected wave power value pr2 from the forward wave power value pf2 is referred to as a load-side power value pl2 (not illustrated).

In addition, in the present specification, a reflection coefficient represented by a ratio of the reflected wave voltage to the forward wave voltage (reflected wave voltage/forward wave voltage) is ρ, and an absolute value (magnitude) of the reflection coefficient ρ is. In addition, subscripts are used as necessary to represent corresponding portions. For example, "1" is used for the system of the first power supply 1 and the first matcher 3, "2" is used for the system of the second power supply 2 and the second matcher 4, "g" is used for the first power supply 1, and "m" is used for the first matcher 3.

The first power supply 1 supplies the forward wave power PF1 to the load by outputting the forward wave voltage VF1 having the fundamental frequency F1. At this time, feedback control is performed such that the forward wave power value pf1 becomes a target power value p0. Note that it is also possible to perform feedback control such that the load-side power value pl1 becomes the target power value p0, but the description thereof will be omitted below.

The forward wave voltage VF1 has a relatively high fundamental frequency F1 suitable for plasma generation. The fundamental frequency F1 is, for example, 40.68 MHz. Of course, the fundamental frequency F1 is not limited to 40.68 MHz, and may be, for example, a frequency of an industrial RF band such as 13.56 MHz or 27.12 MHz. In addition, as described below, the first power supply 1 is configured to perform frequency modulation control and frequency offset control.

The second power supply 2 supplies the second forward wave power to the load by outputting the forward wave voltage VF2 having the fundamental frequency F2 lower than the fundamental frequency F1. At this time, feedback control is performed such that the forward wave power value pf2 becomes a target power value. Note that although feedback control may be performed so that the load-side power value p12 becomes the target power value, the description will be omitted below. The forward wave voltage VF2 has a relatively low fundamental frequency F2 suitable for ion acceleration. The fundamental frequency F2 is, for example, 400 kHz. Of course, the fundamental frequency F2 is not limited to 400 kHz, but may be another frequency. The second power supply 2 is configured to perform pulse modulation that repeats the ON operation of outputting the forward wave voltage VF2 and the OFF operation of not outputting the forward wave voltage VF2 at a predetermined cycle. Here, a period during which the second power supply 2 performs the ON operation is referred to as a second power supply ON period, and a period during which the OFF operation is performed is referred to as a second power supply OFF period.

In the second power supply ON period, the first power supply 1 outputs the forward wave voltage VF1, and the second power supply 2 outputs the forward wave voltage VF2, so that the IMD occurs. However, in the second power supply OFF period, the first power supply 1 outputs the forward wave voltage VF1, but the second power supply 2 does not output the forward wave voltage VF2, so that the IMD does not occur. Switching between the ON operation and the OFF operation by the second power supply 2 is performed based on, for example, a synchronization signal. The synchronization signal is for performing control corresponding to each of the second power supply ON period and the second power supply OFF period. Note that the second power supply 2 may perform pulse modulation that repeats the ON operation and the OFF operation without inputting a synchronization signal. In this case, it is sufficient if the second power supply 2 generates a synchronization signal corresponding to the synchronization pulse signal and outputs the synchronization signal to the first power supply 1 and the superposition matcher 5. In addition, the second matcher 4 of the superposition matcher 5 can generate a synchronization signal. In this case, it is sufficient if the second matcher 4 generates a synchronization signal corresponding to the synchronization pulse signal and outputs the synchronization signal to the first power supply 1.

For example, the superposition matcher 5 is electrically connected between the first power supply 1 and the second power supply 2 and a lower electrode EL1 of the plasma processing apparatus PA (an example of a load). In addition, the superposition matcher 5 includes the first matcher 3, the second matcher 4, and the output unit 51.

The plasma processing apparatus PA, which is an example of a load, is, for example, of a parallel plate type, and the lower electrode EL1 and an upper electrode EL2 face each other in a chamber CH. A substrate SB to be processed can be placed on the lower electrode EL1. The first power supply 1 and the second power supply 2 are electrically connected to the lower electrode EL1 via the superposition matcher 5. The upper electrode EL2 is electrically connected to ground potential. The chamber CH is connected to a gas supply device (not illustrated) via an air supply pipe, and is connected to a vacuum device (not illustrated) via an exhaust pipe.

Figure 2:
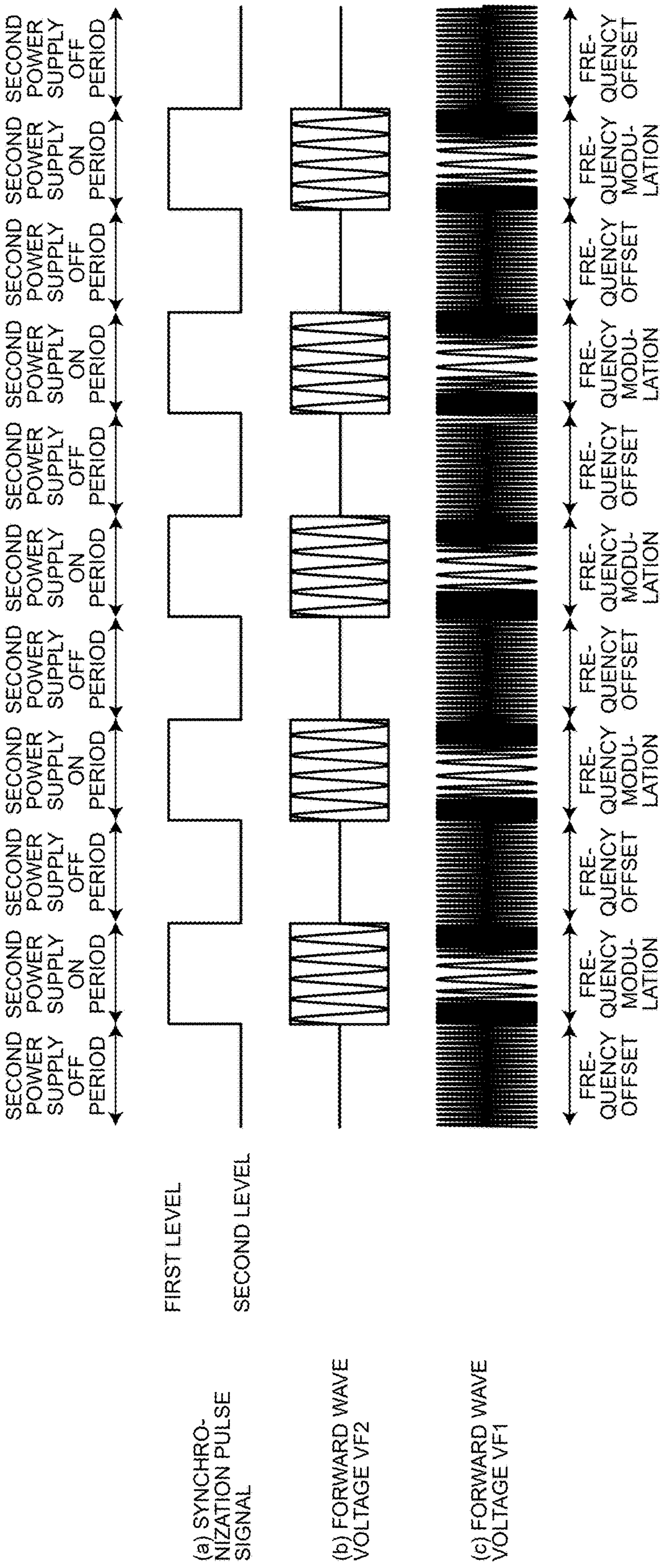
FIG. 2 is a diagram illustrating a relationship between a forward wave voltage and a forward wave voltage with respect to a synchronization pulse signal.

An external control device 61 is, for example, a device that gives various commands (power ON or the like) and conditions such as a target power value to the high-frequency power supply system 90. In addition, for example, it has a function of acquiring and monitoring data such as the forward wave power value pf1 calculated by the first power supply 1. A synchronization pulse generator 62 generates a synchronization pulse signal as an example of a synchronization signal, and supplies the synchronization pulse signal to the first power supply 1, the second power supply 2, and the superposition matcher 5. As illustrated in FIG. 2 to be described below, the synchronization pulse signal is a two-level rectangular wave-shaped pulse signal corresponding to the pulse modulation cycle of the second power supply 2. For example, it is sufficient if the second power supply ON period is set when the synchronization pulse signal is at the first level, and the second power supply OFF period is set when the synchronization pulse signal is at the second level. Usually, the first level>the second level. For example, the first level is "1", and the second level is "0".

As an example of the synchronization signal, an example in which the synchronization pulse signal output from the synchronization pulse generator 62 is used as described above is described, but another synchronization signal may be used. For example, a synchronization signal generated by the second power supply 2 or the second matcher 4 can be used. This is because the second power supply 2 can generate a synchronization signal because the pulse modulation cycle of the second power supply 2 is known. In addition, this is because the second matcher 4 can acquire the pulse modulation cycle of the second power supply 2 based on the information of the forward wave voltage VF2 detected by the second matcher 4.

In addition, the synchronization signal may not be a signal corresponding to each of the second power supply ON period and the second power supply OFF period. For example, it may be a pulse signal or the like corresponding to the start of the second power supply ON period. In this case, there is no signal corresponding to the second power supply OFF period, but since the times of the second power supply ON period and the second power supply OFF period are known, the start timing of the second power supply OFF period can be recognized.

Schematic Operation Description of High-Frequency Power Supply System

The forward wave voltage VF1 output from the first power supply 1 is supplied to the lower electrode EL1 of the plasma processing apparatus PA via the first matcher 3 and the output unit 51. The forward wave voltage VF2 output from the second power supply 2 is supplied to the lower electrode EL1 of the plasma processing apparatus PA via the second matcher 4 and the output unit 51. That is, in the present embodiment, the forward wave voltage VF1 and the forward wave voltage VF2 are superimposed and supplied to the lower electrode EL1 in the output unit 51 inside the superposition matcher 5. As a result, the plasma processing apparatus PA generates plasma PL between the lower electrode EL1 and the upper electrode EL2. In addition, the superposition matcher 5 executes a first matching operation of matching the impedance on the first power supply 1 side with the impedance on the load side in the first matcher 3, and executes a second matching operation of matching the impedance on the second power supply 2 side with the impedance on the load side in the second matcher 4.

Note that the high-frequency power supply system 90 and the plasma processing apparatus PA are not limited to the configuration of FIG. 1. For example, there are various configurations such that the superposition matcher 5 does not include the output unit 51 that superimposes the forward wave voltage VF1 and the forward wave voltage VF2, and the forward wave voltage VF1 output from the first power supply 1 is supplied to the upper electrode EL2 (in this case, unlike FIG. 1, it is not electrically connected to the ground potential) via the first matcher 3, and the forward wave voltage VF2 output from the second power supply 2 is supplied to the lower electrode EL1 via the second matcher 4. The high-frequency power supply system 90 of the present embodiment can also be used for such other configurations.

As described above, when a plurality of forward wave voltages having difference in height between the fundamental frequencies is supplied from the first power supply 1 and the second power supply 2 to the load, a phenomenon in which the reflected wave power value pr1 detected on the first power supply 1 side fluctuates according to a basic cycle (cycle of the fundamental wave) on the second power supply 2 side occurs due to the effect of the IMD. The reflected wave power value pr1 at this time is relatively large. Therefore, in order to reduce a reflection coefficient absolute value Γ1 on the first power supply 1 side, the first power supply 1 performs frequency modulation control and frequency offset control, and the first matcher 3 executes a matching operation of matching the impedance on the first power supply 1 side with the impedance on the load side.

FIG. 2 is a diagram illustrating a relationship between the forward wave voltage VF2 and the forward wave voltage VF1 with respect to a synchronization pulse signal. FIG. 2(*a*) illustrates an example of the synchronization pulse signal, FIG. 2(*b*) illustrates an example of the forward wave voltage VF2, and FIG. 2(*c*) illustrates an example of the forward wave voltage VF1.

As illustrated in FIG. 2(*a*), the synchronization pulse signal is a rectangular wave-shaped pulse signal that repeats the first level and the second level. As illustrated in FIG. 2(*b*), the second power supply 2 performs the ON operation when the synchronization pulse signal is at the first level, and thus outputs the forward wave voltage VF2. In addition, the second power supply 2 performs the OFF operation when the synchronization pulse signal is at the second level, and thus does not output the forward wave voltage VF2.

As described above, since the second power supply ON period is when the second power supply 2 performs the ON operation, and the second power supply OFF period is when the second power supply 2 performs the OFF operation, the IMD occurs during the second power supply ON period, but the IMD does not occur during the second power supply OFF period. Therefore, since the first power supply 1 performs frequency modulation control during the second power supply ON period and performs frequency offset control during the second power supply OFF period, the fundamental frequency of the forward wave voltage VF1 of the first power supply 1 is different between the second power supply ON period and the second power supply OFF period as illustrated in FIG. 2(*c*). However, as illustrated in FIG. 2(*c*), the amplitude of the forward wave voltage VF1 of the first power supply 1 is the same between the second power supply ON period and the second power supply OFF period.

Note that FIG. 2(*c*) is an example of the forward wave voltage VF1 after a modulation parameter search process of the frequency modulation control and an offset frequency search process of the frequency offset control described below are completed. In addition, in FIG. 2(*c*), as can be seen that the frequency modulation is performed, the frequency of the first and last portions of the second power supply ON period is increased and the frequency of the central portion is decreased, but it is not limited thereto.

Details of First Power Supply

The first power supply 1 performs frequency modulation control of frequency-modulating the forward wave voltage VF1 with a modulation signal having the same frequency F2 as the second fundamental frequency in the second power supply ON period. In addition, the first power supply 1 performs frequency offset control to output a forward wave voltage VF3 having the fundamental frequency F3 obtained by adding the offset frequency Fos to the fundamental frequency F1 in the second power supply OFF period. Note that as one aspect of the frequency offset control, the offset frequency Fos may be 0 Hz. That is, the frequency offset control may not be substantially performed. Even in this case, there is no adverse effect due to the frequency modulation control performed during the second power supply OFF period, and thus there is an effect. For example, when it is known that the offset frequency Fos may be 0 Hz, it is not necessary to perform the offset frequency search process.

Hereinafter, the configuration of the first power supply 1 will be described with reference to FIG. 1. The first power supply 1 includes a first power supply communication unit 11, a modulation signal generation module 10, a modulated signal generation module 12, an amplitude adjustment module 13, an amplification module 14, a first power supply sensor 15, a power information calculation module 16, a target power setting module 18, a subtraction module 19, and a power control module 20. Note that, in the first power supply 1, a portion that performs calculation processing and signal processing can be configured by, for example, a central processing unit (CPU), a field programmable gate array (FPGA), a storage medium such as a memory, or the like. In addition, the operation of each unit can be controlled according to a control program stored in advance in read only memory (ROM) or the like, and processing such as input/output, calculation, and time measurement can be performed. In addition, the first power supply 1 includes a basic clock generation unit, which is not illustrated, and processing is executed for each control cycle on the basis of a clock signal output from the basic clock generation unit.

The first power supply communication unit 11 receives the synchronization pulse signal output from the synchronization pulse generator 62 as a synchronization signal, and outputs the synchronization pulse signal to the modulation signal generation module 10, the power information calculation module 16, and the target power setting module 18. In addition, communication can be performed with the first matcher 3 and the second matcher 4. For example, an initial phase search command can be received from the first matcher 3.

In addition, the first power supply communication unit 11 can also communicate with the external control device 61. For example, information such as the target power value p0 can be input from the external control device 61 and output toward the target power setting module 18. In addition, for example, the forward wave power value pf1 and the reflected wave power value pr1 calculated by the power information calculation module 16 can be output to the external control device 61. In the external control device 61, it is possible to utilize the input information, for example, monitoring the input information. Additionally, transmission and reception can be performed with the first matcher 3 and the second matcher 4, but the description thereof will be omitted.

The modulation signal generation module 10 generates a modulation signal having the same frequency as the fundamental frequency F2, and outputs the modulation signal to the modulated signal generation module 12. The modulation signal is a signal for determining the frequency of the forward wave voltage VF1 output from the first power supply 1, and has waveform information corresponding to the ON operation and the OFF operation of the second power supply 2. This modulation signal will be described below. Note that the modulation signal generation module 10 can recognize the second power supply ON period and the second power supply OFF period based on the synchronization signal output from the first power supply communication unit 11.

The modulated signal generation module 12 outputs a modulated signal in which an initial phase α, a frequency shift Fd, and the offset frequency Fos are adjusted based on the frequency information indicated by the modulation signal. The modulated signal generation module 12 can use, for example, a direct digital synthesizer (DDS).

The modulated signal has a waveform similar to that in FIG. 2(*c*), and has a waveform in which a period in which frequency modulation is performed and a period in which the frequency is constant are repeated. That is, the modulated signal has a constant amplitude, but is frequency-modulated by the modulation signal during the second power supply ON period, and is a waveform signal whose frequency is offset by the modulation signal during the second power supply OFF period. Note that the modulated signal has a waveform similar to that of the forward wave voltage VF1 in FIG. 2(*c*), and thus is represented as an analog waveform signal, but the modulated signal is actually digital data, and data is generated and output in each control cycle.

The amplitude adjustment module 13 receives the modulated signal output from the modulated signal generation module 12 and an amplitude adjustment signal output from the power control module 20. Then, the amplitude of the modulated signal is adjusted on the basis of the amplitude adjustment signal, and the signal is output to the amplification module 14 as a forward wave voltage initial signal VFlini. As a result, the amplitude of the forward wave voltage VF1 is changed such that the forward wave power value pf1, which is the power value of a first forward wave power PF output from the first power supply 1 (amplification module 14), becomes the target power value p0 set by the target power setting module 18 described below. Note that the forward wave voltage initial signal VFlini output from the amplitude adjustment module 13 is actually digital data, and data is generated and output for each control cycle. In addition, a D/A converter, which is not illustrated, is provided between the amplitude adjustment module 13 and the amplification module 14.

The amplification module 14 amplifies the forward wave voltage initial signal VFlini output from the amplitude adjustment module 13 and outputs the signal as the forward wave voltage VF1. The waveform of the forward wave voltage VF1 has a waveform similar to that of the modulated signal output from the modulated signal generation module 12. Of course, the amplitudes of the modulated signal and the forward wave voltage VF1 are different, but frequencies thereof are the same.

That is, it can be said that the first power supply 1 performs frequency modulation control to modulate the forward wave voltage VF1 with a modulation signal having the same frequency (400 kHz in the present embodiment) as the fundamental frequency F2 in the second power supply ON period, and performs frequency offset control to output the forward wave voltage VF3 having the fundamental frequency F3 obtained by adding the offset frequency Fos to the fundamental frequency F1 in the second power supply OFF period. In addition, a filter for removing harmonic components and the like may be provided at a preceding stage of the amplification module 14. In addition, a filter for removing harmonic components and the like may be provided at a subsequent stage of the amplification module 14.

The first power supply sensor 15 is provided at the output end of the first power supply 1, passes the forward wave voltage VF1 output from the amplification module 14, and outputs the forward wave voltage VF1 toward the first matcher 3 of the superposition matcher 5. In addition, the forward wave voltage VF1 output from the amplification module 14 is detected, and a forward wave voltage detection signal vf1*g* that is the detection signal is output to the power information calculation module 16. In addition, the reflected wave voltage VR1 that is reflected from the load side and returned to the first power supply 1 is detected, and reflected wave voltage detection signal vr1g that is the detection signal is output to the power information calculation module 16.

Note that an A/D converter, which is not illustrated, is provided between the first power supply sensor 15 and the power information calculation module 16.

The power information calculation module 16 receives the forward wave voltage detection signal vf1g and the reflected wave voltage detection signal vr1g output from the first power supply sensor 15, and calculates the forward wave power value pf1 and the reflected wave power value pr1 based on the received signals. In addition, the reflection coefficient absolute value Γcan be calculated based on the calculated forward wave power value pf1 and reflected wave power value pr1. In addition, the reflection coefficient p1 can be calculated based on the forward wave voltage detection signal vf1g and the reflected wave voltage detection signal vr1g.

(1) Forward Wave Power Value

The power information calculation module 16 calculates the forward wave power value pf1 based on the input forward wave voltage detection signal vf1g. For example, the input forward wave voltage detection signal vf1g is squared, information of an unnecessary frequency component is then cut by a low-pass filter (for example, an IIR filter or the like) that extracts a desired component, and a constant for conversion into the forward wave power value pf1 is further multiplied to calculate the forward wave power value pf1. The forward wave power value pf1 can be calculated by, for example, a forward wave voltage detection signal vf1g^2/R (R: gain corresponding to resistance value). The calculated forward wave power value pf1 is output to the modulation signal generation module 10 and the subtraction module 19.

Of course, the calculation method is not limited to the above. For example, a moving average value of a predetermined period may be used. In addition, an average value of a predetermined period may be used. In short, it is sufficient if information regarding the forward wave power value pf1 is calculated. In the following description, the forward wave power value pf1 is simply referred to including a case where processing such as calculation of a moving average value or an average value is performed.

In addition, the forward wave power value pf1 calculated based on the forward wave voltage detection signal vf1g detected during the second power supply ON period is set as a forward wave power value pf11, the forward wave power value pf1 calculated based on the forward wave voltage detection signal vf1g detected during the second power supply OFF period is set as a forward wave power value pf12, and the forward wave power value pf1 calculated based on the forward wave voltage detection signal vf1g detected in both periods: the second power supply ON period and the second power supply OFF period is set as a forward wave power value pf13.

In addition, the forward wave power value pf1 is output to the modulation signal generation module 10 and the subtraction module 19 to be described below, but they may be different from each other. For example, the condition of the low-pass filter may be different.

(2) Reflected Wave Power Value

The power information calculation module 16 calculates the reflected wave power value pr1 based on the input reflected wave voltage detection signal vr1g. For example, the input reflected wave voltage detection signal vr1g is squared, information of an unnecessary frequency component is then cut by a low-pass filter (for example, an IIR filter or the like) that extracts a desired component, and a constant for conversion into the reflected wave power value pr1 is further multiplied to calculate the reflected wave power value pr1. The reflected wave power value pr1 can be calculated by, for example, a reflected wave voltage detection signal vr1g^2/R (R: gain corresponding to resistance value). The calculated reflected wave power value pr1 is output to the modulation signal generation module 10.

Of course, the calculation method is not limited to the above. For example, a moving average value of a predetermined period may be used. In addition, an average value of a predetermined period may be used. In short, it is sufficient if information regarding the reflected wave power value pr1 is calculated. In the following description, the reflected wave power value pr1 is simply referred to including a case where processing such as calculation of a moving average value or an average value is performed.

In addition, the reflected wave power value pr1 calculated based on the reflected wave voltage detection signal vr1g detected during the second power supply ON period is set as a reflected wave power value pr11, the reflected wave power value pr1 calculated based on the reflected wave voltage detection signal vr1g detected during the second power supply OFF period is set as a reflected wave power value pr12, and the reflected wave power value pr1 calculated based on the reflected wave voltage detection signal vr1g detected in both periods: the second power supply ON period and the second power supply OFF period is set as a reflected wave power value pr13.

(3) Reflection Coefficient Absolute Value

The power information calculation module 16 calculates the reflection coefficient absolute value Γ1 based on the forward wave power value pf1 and the reflected wave power value pr1 described above. The reflection coefficient absolute value Γ1 can be calculated by, for example, V (reflected wave power value pr1/forward wave power value pf1). The calculated reflection coefficient absolute value Γ1 is output to the modulation signal generation module 10.

Of course, the calculation method is not limited to the above. For example, a moving average value of a predetermined period may be used. In addition, an average value of a predetermined period may be used. In short, it is sufficient if information regarding the reflection coefficient absolute value Γ1 is calculated. In the following description, the reflection coefficient absolute value Γ1 is simply referred to including a case where processing such as calculation of a moving average value or an average value is performed.

In addition, the reflection coefficient absolute value Γ1 calculated based on the forward wave power value pf1 and the reflected wave power value pr1 detected during the second power supply ON period is set as a reflection coefficient absolute value Γ11, the reflection coefficient absolute value Γ1 calculated based on the forward wave power value pf1 and the reflected wave power value pr1 detected during the second power supply OFF period is set as a reflection coefficient absolute value Γ12, and the reflection coefficient absolute value Γ1 calculated based on the forward wave power value pf1 and the reflected wave power value pr1 detected in both periods: the second power supply ON period and the second power supply OFF period is set as a reflection coefficient absolute value Γ13.

(4) Reflection Coefficient and Load-Side Impedance

The power information calculation module 16 calculates the reflection coefficient ρ1 based on the forward wave voltage detection signal vf1g and reflected wave voltage detection signal vr1g described above. The reflection coefficient ρ1 can be calculated by, for example, a reflected wave voltage detection signal vr1*m*/a forward wave voltage detection signal vf1*m*. In addition, the load-side impedance Z1 that can be mutually converted with the reflection coefficient ρ1 can be calculated. The calculated reflection coefficient ρ1 and load-side impedance Z1 are output to the modulation signal generation module 10.

In addition, the reflection coefficient ρ1 calculated during the second power supply ON period is set as a reflection coefficient ρ11, and the load-side impedance Z1 calculated during the second power supply ON period is set as a load-side impedance Z11. In addition, the reflection coefficient ρ1 calculated during the second power supply OFF period is set as a reflection coefficient ρ12, and the load-side impedance Z1 calculated during the second power supply OFF period is set as a load-side impedance Z12.

In addition, the reflection coefficient ρ1 calculated in both periods: the second power supply ON period and the second power supply OFF period is set as a reflection coefficient ρ13, and the load-side impedance Z1 calculated in both periods: the second power supply ON period and the second power supply OFF period is set as a load-side impedance Z13.

Note that among the calculated values such as the forward wave power value pf1 calculated by the power information calculation module 16, a value that is not used in the subsequent process may not be calculated.

In the target power setting module 18, the target power value p0 is set in advance as a target value of the forward wave power value pf1. The target power setting module 18 outputs the target power value p0 to the subtraction module 19.

The subtraction module 19 subtracts the forward wave power value pf1 from the target power value p0 and outputs a subtraction result as error information Δpf to the power control module 20.

The power control module 20 generates an amplitude adjustment signal for controlling the amplitude of the forward wave voltage initial signal VFlini according to the error information Δpf and outputs the amplitude adjustment signal to the amplitude adjustment module 13. As a result, the amplitude of the forward wave voltage initial signal VFlini can be determined. That is, the amplitude of the forward wave voltage VF1 can be adjusted by adjusting the magnitude of the amplitude adjustment signal, and eventually, the forward wave power value pf1 can be adjusted.

For example, when the target power value p0 is 1,000 [W] and the forward wave power value pf1 is 950 [W], since 50 [W] is short of the target power value p0, and therefore the power control module 20 determines the magnitude of the amplitude adjustment signal so as to increase the forward wave power value pf1 to be supplied to the load by 50 [W] and outputs the signal. For example, a known method such as PI control or PID control can be used to control the amplitude of such forward wave voltage initial signal VFlini.

Note that since the target power setting module 18 can output a target power value p01 for the second power supply ON period and a target power value p02 for the second power supply OFF period, the power value can be controlled by distinguishing the second power supply ON period and the second power supply OFF period.

Details of Superposition Matcher

The superposition matcher 5 includes the first matcher 3, the second matcher 4, and the output unit 51. For example, the first matcher 3 is electrically connected between the first power supply 1 and the lower electrode EL1. For example, the second matcher 4 is electrically connected between the second power supply 2 and the lower electrode EL1. The first matcher 3 executes the first matching operation, and the second matcher 4 executes the second matching operation.

First Matcher

The first matcher 3 includes a first-side communication unit 31, a first-side sensor 32, a first-side matching circuit 33, a first-side calculation module 34, and a first-side control module 35. Note that, in the first matcher 3, a portion that performs calculation processing and signal processing can be configured by, for example, a central processing unit (CPU), a field programmable gate array (FPGA), a storage medium such as a memory, or the like. In addition, the operation of each unit can be controlled according to a control program stored in advance in read only memory (ROM) or the like, and processing such as input/output, calculation, and time measurement can be performed. In addition, the first matcher 3 includes a basic clock generation unit, which is not illustrated, and processing is executed for each control cycle on the basis of a clock signal output from the basic clock generation unit.

The first-side communication unit 31 receives the synchronization pulse signal output from the synchronization pulse generator 62 as a synchronization signal, and outputs the synchronization pulse signal to the first-side calculation module 34 and the first-side control module 35. In addition, the first-side communication unit 31 can communicate with the first power supply 1 and the second matcher 4. For example, the reflection coefficient ρ1 calculated by the first matcher 3 can be output toward the first power supply 1.

The first-side sensor 32 is provided at the input end of the first matcher 3, and detects information for calculating the load-side impedance Z1 when the load side is viewed from the input end of the first matcher 3 (equivalent to the output end of the first power supply 1) or information for calculating the reflection coefficient ρ1 at the input end of the first matcher 3. Since the load-side impedance Z1 and the reflection coefficient ρ1 can be mutually converted, either of them may be detected.

In the case of calculating the load-side impedance Z1, for example, a voltage detector and a current detector are used as the first-side sensor 32. In this case, the voltage at the input end of the first matcher 3 is detected by the voltage detector, and a voltage detection signal v1 is output as the detection signal. In addition, the current at the input end of the first matcher 3 is detected by the current detector, and a current detection signal i1 is output as the detection signal. The voltage detection signal v1 and the current detection signal i1 are output to the first-side calculation module 34.

When the reflection coefficient ρ1 at the input end of the first matcher 3 is calculated, for example, a directional coupler is used as the first-side sensor 32. In this case, the forward wave voltage VF1 output from the first power supply 1 is detected, the forward wave voltage detection signal vf1*m* is output as the detection signal, the reflected wave voltage VR1 reflected from the load side and returning is detected, and the reflected wave voltage detection signal vr1*m* is output as the detection signal. The forward wave voltage detection signal vf1*m* and the reflected wave voltage detection signal vr1*m* are output to the first-side calculation module 34. Note that an A/D converter, which is not illustrated, is provided between the first-side sensor 32 and the first-side calculation module 34.

The first-side matching circuit 33 is provided between the first-side sensor 32 and the output unit 51. The first-side matching circuit 33 internally includes a variable element such as a variable capacitor capable of capacitance change, for example, and can adjust the load-side impedance Z1 when the load side is viewed from the input end of the first matcher 3 by changing a variable value (capacitance for variable capacitor and inductance for variable inductor) of the variable element in accordance with a command from the first-side control module 35 to be described below. A variable inductor may be provided as the variable element. In addition, a drive circuit, which is not illustrated, is provided to change the capacitance of the variable element in accordance with a command from the first-side control module 35.

In addition, in addition to the variable element, an inductor having a fixed inductance value is often provided. In addition, a capacitor having a fixed capacitance value may be provided.

As such a first-side matching circuit 33, a matching circuit of a so-called inverted L type (also referred to as an L type), a π type, or the like is often used.

Note that there are various types of variable capacitors. For example, there is a variable capacitor of a type in which the capacitance is changed by changing a distance between electrodes. In addition, there is a variable capacitor of a type in which a plurality of capacitors connected in series to a switch is connected in parallel, and the overall capacitance is changed by changing the state (ON/OFF) of the switch. Thus, the type of the variable capacitor is not limited.

The first-side calculation module 34 calculates the reflection coefficient ρ1 or the load-side impedance Z1 on the basis of the information output from the first-side sensor 32, and outputs the reflection coefficient ρ1 or the load-side impedance Z1 to the first-side control module 35 as a first-side load information. The reflection coefficient ρ1 and the load-side impedance Z1 are information indicating the state of the load. Note that the first-side calculation module 34 may include a filter for removing unnecessary signal components (for example, harmonic components) on the input side. At this time, it is sufficient if a filter method is appropriately selected.

The reflection coefficient ρ1 can be calculated by, for example, a reflected wave voltage detection signal vr1*m*/a forward wave voltage detection signal vf1*m*. In addition, the load-side impedance Z1 can be calculated by, for example, the voltage detection signal v1/the current detection signal i1. In addition, the load-side impedance Z1 can be calculated based on, for example, the magnitude of the voltage detection signal v1, the magnitude of the current detection signal i1, and a phase difference θ between the voltage detection signal v1 and the current detection signal i1. Since a method of calculating the reflection coefficient ρ1 and the load-side impedance Z1 is well known, the description thereof will be omitted.

In addition, since the reflection coefficient ρ1 and the load-side impedance Z1 can be mutually converted, in order to simplify the description, only the case of either the reflection coefficient ρ1 or the load-side impedance Z1 is described below with respect to the first-side calculation module 34.

In addition, the reflection coefficient ρ1 calculated during the second power supply ON period based on the information detected by the first-side sensor 32 is set as a reflection coefficient ρ11, and the load-side impedance Z1 calculated during the second power supply ON period based on the information detected by the first-side sensor 32 is set as a load-side impedance Z11.

In addition, the reflection coefficient ρ1 calculated during the second power supply OFF period based on the information detected by the first-side sensor 32 is set as a reflection coefficient ρ12, and the load-side impedance Z1 calculated during the second power supply OFF period based on the information detected by the first-side sensor 32 is set as a load-side impedance Z12.

In addition, the reflection coefficient ρ1 calculated in both periods: the second power supply ON period and the second power supply OFF period based on the information detected by the first-side sensor 32 is set as a reflection coefficient ρ13, and the load-side impedance Z1 calculated in both periods: the second power supply ON period and the second power supply OFF period based on the information detected by the first-side sensor 32 is set as a load-side impedance Z13.

Using the first-side load information output from the first-side calculation module 34, the first-side control module 35 outputs a command signal for controlling the variable value of the variable element in the first-side matching circuit 33 so that the absolute value Γ1 of the reflection coefficient ρ1 approaches a target reflection coefficient absolute value Γ0 (usually 0). In other words, a command signal for controlling the variable value of the variable element in the first-side matching circuit 33 is output such that the load-side impedance Z1 becomes a complex conjugate of an output impedance Z0 of the first power supply 1. For example, when the variable element included in the first-side matching circuit 33 is a variable capacitor, a command signal for controlling the capacitance is output. More specifically, for example, the capacitance of the variable capacitor in which the absolute value Γ1 of the reflection coefficient ρ1 is predicted to be closest to the target reflection coefficient absolute value Γ0 is calculated, and the command signal is output to the drive circuit that drives the variable capacitor so as to reach the calculated capacitance.

The first-side control module 35 repeatedly performs such control. As a result, when the absolute value Γ1 of the reflection coefficient ρ1 becomes equal to or less than a predetermined threshold, it is regarded that the first matching operation is completed, and a completion notification indicating that the first matching operation is completed can be output to the first power supply 1 via the first-side communication unit 31. Since there are many methods of such matching operation disclosed in, for example, JP 3183914 B2, JP 4975291 B2, JP 6084417 B2, JP 6177012 B2, JP 6312405 B2, JP 7105185 B2, JP 7105184 B2, JP 7112952 B2, JP 6898338 B2, and JP 6773283 B2, it is sufficient if a suitable control method is selected.

Note that the first matching operation in the first matcher 3 is not limited to the above. For example, the variable value of the variable element in the first-side matching circuit 33 may be set to a predetermined variable value instead of the automatic matching. It is sufficient if the predetermined variable value is determined by, for example, an experiment.

The second matcher 4 includes a second-side communication unit 41, a second-side sensor 42, a second-side matching circuit 43, a second-side calculation module 44, a second-side control module 45, and a phase reset signal generation module 46. Although applied frequencies and the like are different except for the phase reset signal generation module 46, they have the same functions as the first-side communication unit 31, the first-side sensor 32, the first-side matching circuit 33, the first-side calculation module 34, and the first-side control module 35 of the first matcher 3, and thus, the description thereof will be omitted.

Note that, similarly to the first-side calculation module 34, the second-side calculation module 44 calculates a reflection coefficient ρ2 or a load-side impedance Z2 on the basis of the information (reflected wave voltage detection signal vr2*m* and forward wave voltage detection signal vf2*m*, or voltage detection signal v2 and current detection signal 12) output from the second-side sensor 42, and outputs the reflection coefficient ρ2 or the load-side impedance Z2 to the second-side control module 45 as second-side load information.

Figure 3:
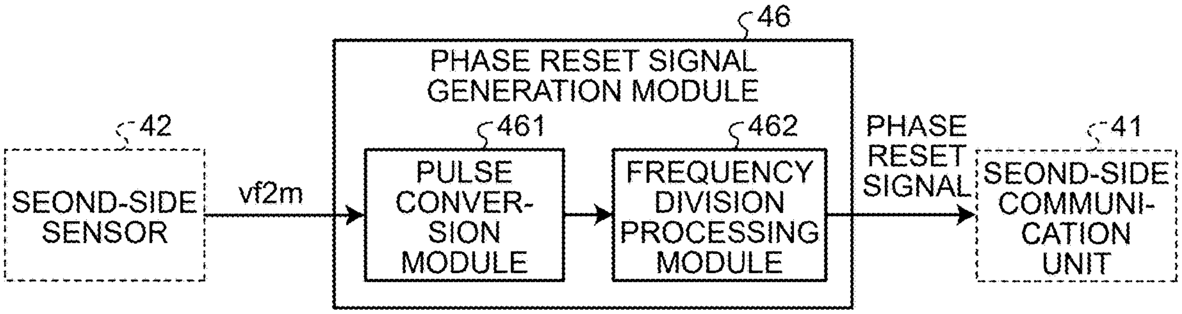
FIG. 3 is a diagram illustrating a configuration example of a phase reset signal generation module.
Figure 4:
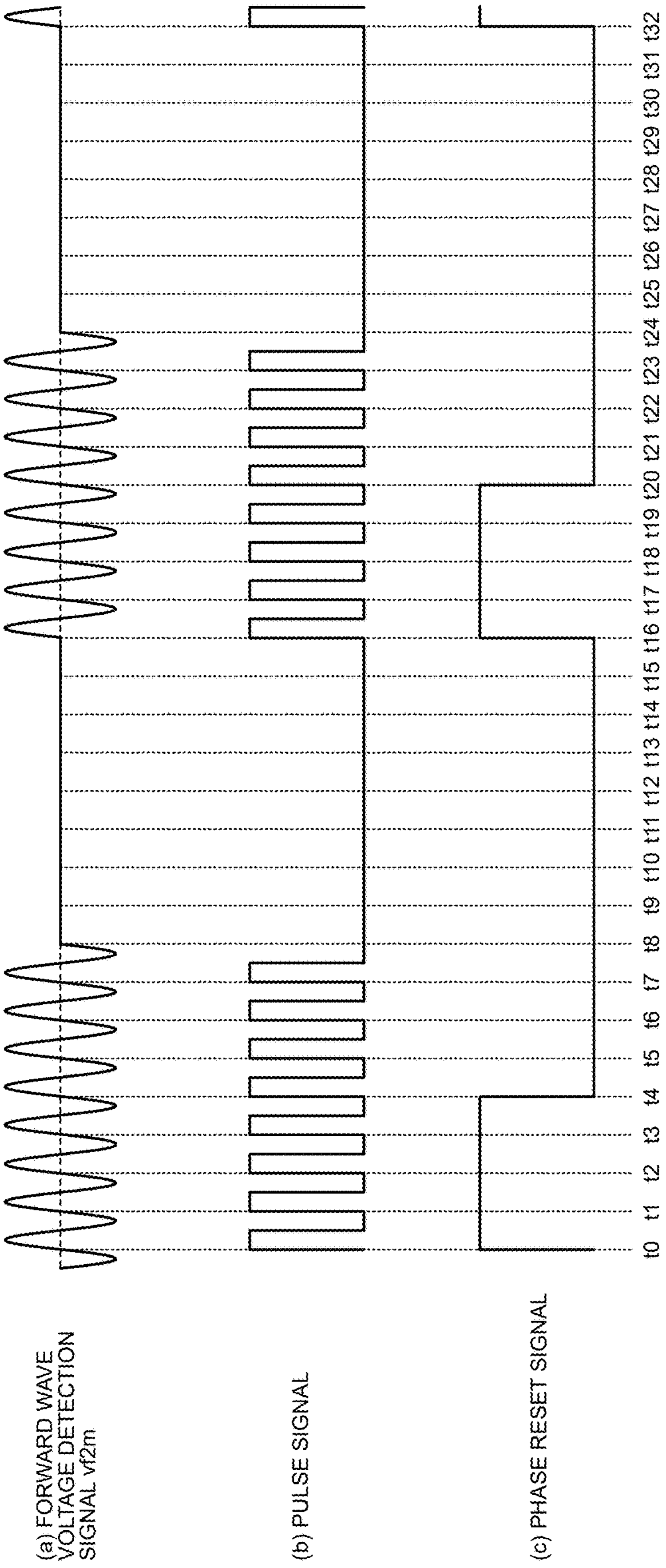
FIG. 4 is a diagram for describing a method of generating a phase reset signal.

FIG. 3 is a diagram illustrating a configuration example of the phase reset signal generation module 46. FIG. 4 is a diagram for describing a method of generating a phase reset signal. The phase reset signal generation module 46 includes a pulse conversion module 461 and a frequency division processing module 462.

The pulse conversion module 461 includes a comparator, and converts the sinusoidal forward wave voltage detection signal vf2*m* in the second power supply ON period into a rectangular signal using the comparator. For example, as illustrated in FIG. 4(*a*), when the amplitude of the forward wave voltage detection signal vf2*m* is set to a High level when exceeding the center of amplitude and is set to a Low level falling below the center of amplitude, a pulse signal corresponding to the forward wave voltage detection signal vf2*m* can be generated as illustrated in FIG. 4(*b*).

Note that in the forward wave voltage detection signal vf2*m*, for example, a period between timings to and t1, a period between timings t1 and t2, . . . , and a period between timings t7 and t8 are one cycle corresponding to the basic cycle of the second power supply 2. In addition, a period from timings to to t8 and a period from timings t16 to t24 are the second power supply ON period, so that the forward wave voltage detection signal vf2*m* can be detected, but a period from timings t8 to t16 and a period from timings t24 to t32 are the second power supply OFF period, so that the forward wave voltage detection signal vf2*m* cannot be detected.

The frequency division processing module 462 divides the pulse signal having the fundamental frequency F2 by N (N is an integer of 2 or more), and generates a phase reset signal having a pulse frequency of F2/N. The phase reset signal generation module 46 outputs the generated phase reset signal to the first power supply 1 via the second-side communication unit 41.

In the present embodiment, since the fundamental frequency F2 is 400 kHz, as illustrated in FIG. 4(*c*), in the case of N=8, the pulse frequency F2/N=400 kHz/8=50 kHz. Since the phase reset signal is a signal generated based on the actual forward wave voltage VF2, the phase reset signal becomes a signal synchronized with the forward wave voltage VF2.

Regarding Modulation Signal

Figure 5:
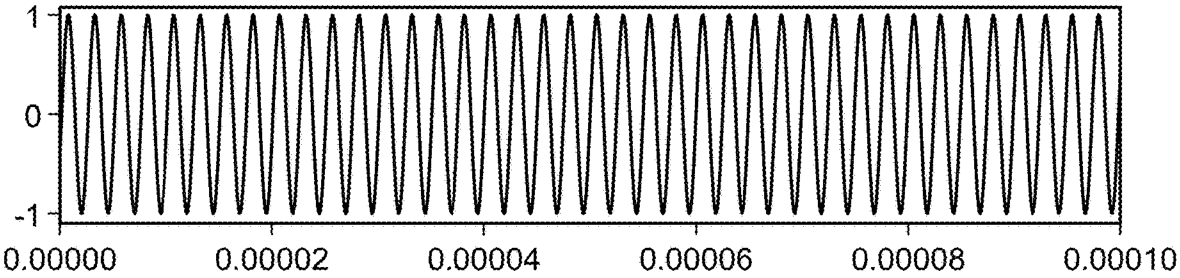
FIG. 5 is an image diagram of a fundamental modulation signal that is a source of a modulation signal.

FIG. 5 is an image diagram of a fundamental modulation signal that is a source of a modulation signal. In FIG. 5, the horizontal axis represents time, and the vertical axis represents frequency. As illustrated in FIG. 5, the modulation signal generation module 10 first generates a sine wave signal having the same frequency as the fundamental frequency F2 as a fundamental modulation signal. At this time, the waveform is shifted in the time axis direction by the initial phase α in consideration of the initial phase α as described below. Note that the amplitude indicating the frequency shift Fd is, for example, ±1. This is because the amplitude is set and the waveform is adjusted in a subsequent process. Such a fundamental modulation signal can be generated by, for example, a direct digital synthesizer (DDS).

Figure 6:
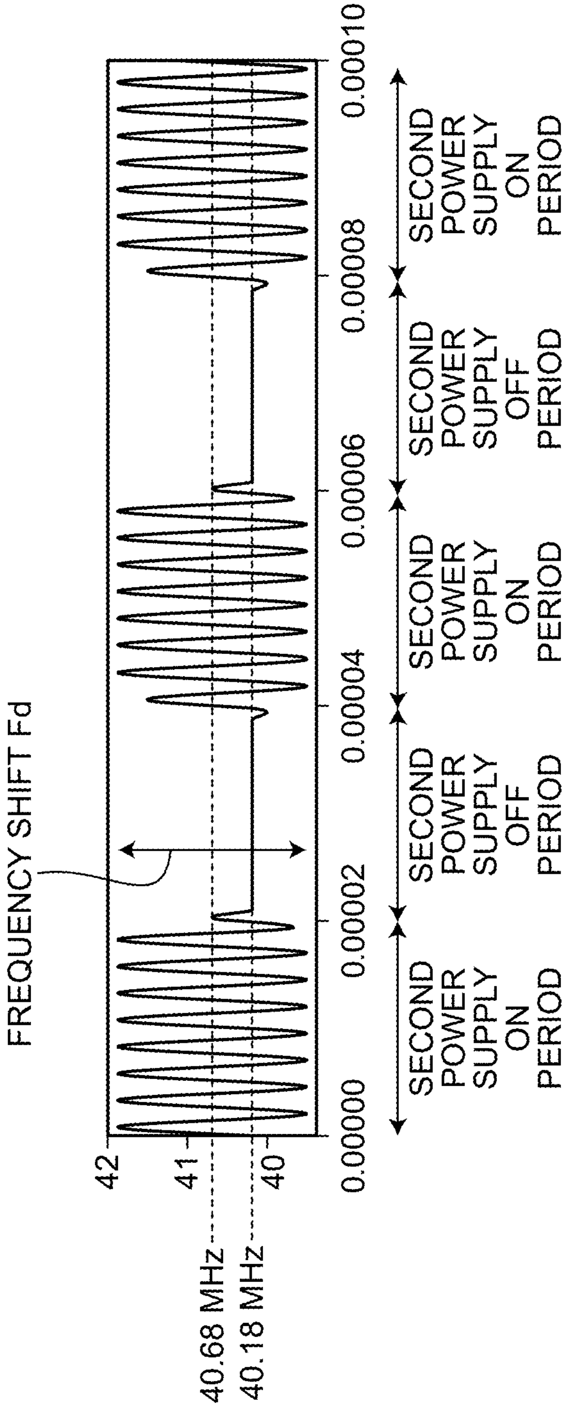
FIG. 6 is an image diagram of the modulation signal.

FIG. 6 is an image diagram of a modulation signal. In FIG. 6, the horizontal axis represents time, the vertical axis represents frequency, and a change in fundamental frequency of the first power supply 1 in the second power supply ON period and the second power supply OFF period is illustrated. Note that, in FIG. 6, the modulation signal is represented as an analog waveform signal, but the modulation signal is actually digital data, and data indicating frequency information is generated and output in each control cycle.

Figure 7:
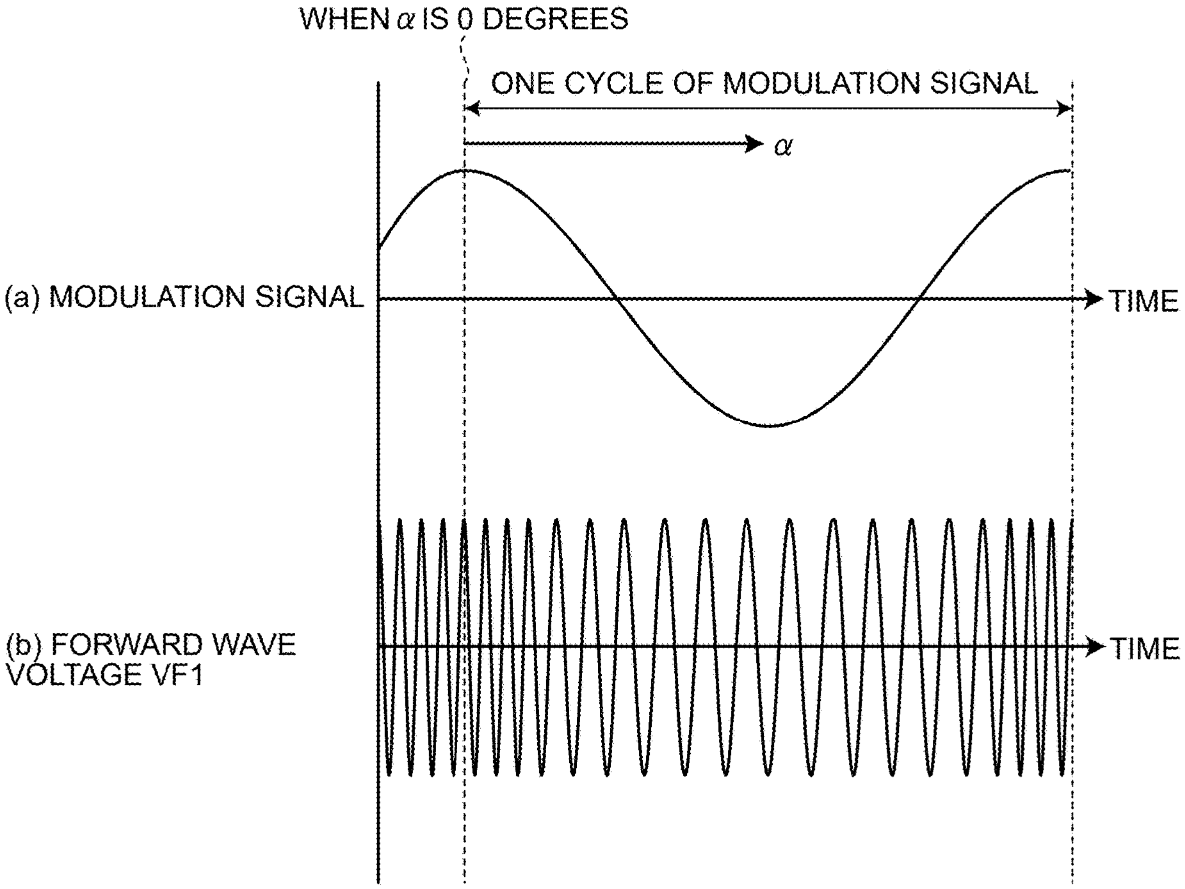
FIG. 7 is a diagram illustrating a relationship between the modulation signal and the forward wave voltage.

FIG. 7 is a diagram illustrating a relationship between a modulation signal and the forward wave voltage VF1. FIG. 7(*a*) illustrates a waveform of one cycle of the modulation signal during the second power supply ON period, and FIG. 7(*b*) illustrates a waveform of the forward wave voltage VF1 output from the first power supply 1 in a period corresponding to the modulation signal.

In the example of FIG. 6, the duty ratio of the pulse modulation is 50% (the time of the second power supply ON period and the time of the second power supply OFF period are the same), and the time of the second power supply ON period and the time of the second power supply OFF period are both 20 μsec. That is, the frequency of the pulse modulation is 1/40 μsec=25 kHz. Note that the frequency of the modulation signal with respect to the time axis is the same frequency (400 kHz in the present embodiment) as the fundamental frequency F2.

In addition, the example of FIG. 6 illustrates a case where the fundamental frequency F1 of the first power supply 1 in the second power supply ON period is 40.68 MHZ and the frequency shift Fd is +1.2 MHZ. Therefore, in the second power supply ON period, the fundamental frequency F1 fluctuates in a range of +1.2 MHz around 40.68 MHZ. Note that, in the example of FIG. 6, the frequency shift Fd is +1.2 MHz, but is not limited thereto, and can be adjusted within the specification range of the first power supply 1.

By adjusting the frequency shift Fd, the reflection coefficient absolute value Γ1 can be reduced. That is, the reflected wave power value pr1 can be reduced. As described above, as the reflection coefficient absolute value Γ1 decreases, the reflected wave power value pr1 also decreases, and thus it is sufficient if control is performed on the basis of either the reflection coefficient absolute value Γ1 or the reflected wave power value pr1.

In addition, in the example of FIG. 6, instead of setting the frequency shift Fd to +1.2 MHZ in the entire second power supply ON period, the frequency shift Fd is decreased at the start of the second power supply ON period, the frequency shift Fd is gradually increased with the lapse of time, and the frequency shift Fd is finally set to +1.2 MHZ. Conversely, the frequency shift Fd is gradually decreased at the end of the second power supply ON period. However, it is not limited thereto, and for example, the frequency shift Fd may be set to +1.2 MHz in the entire second power supply ON period. As described above, the setting of the frequency shift Fd can be set according to the situation.

In addition, the example of FIG. 7 illustrates a waveform of the forward wave voltage VF1 output from the first power supply 1 in a period corresponding to the modulation signal in a case where the phase (hereinafter, referred to as the initial phase α) at the start of one cycle of the modulation signal is zero degrees. When there is the correspondence relationship as illustrated in FIG. 7, the frequency of the forward wave voltage VF1 at zero degrees in one cycle of the modulation signal is high, the frequency of the forward wave voltage VF1 at 180 degrees in one cycle of the modulation signal is low, and the frequency of the forward wave voltage VF1 at 360 degrees in one cycle of the modulation signal is high.

However, since the waveform can be shifted in the time axis direction by changing the value of the initial phase α, the correspondence relationship can be changed. For example, when the initial phase α is set to 180 degrees, the correspondence relationship can be changed to the correspondence relationship in which the frequency of the forward wave voltage VF1 at zero degrees in one cycle of the modulation signal is low, the frequency of the forward wave voltage VF1 at 180 degrees in one cycle of the modulation signal is high, and the frequency of the forward wave voltage VF1 at 360 degrees in one cycle of the modulation signal is low. In practice, the initial phase α is used at the stage of generating the fundamental modulation signal described in FIG. 5, and the waveform is shifted in the time axis direction. Then, the reflection coefficient absolute value Γ1 can also be decreased by adjusting the initial phase α.

That is, the reflection coefficient absolute value Γ1 (reflected wave power value pr1) can be reduced by adjusting the initial phase α and the frequency shift Fd in the second power supply ON period. Therefore, a modulation parameter search process of searching for the optimum value of the initial phase α and the optimum value of the frequency shift Fd based on the reflection coefficient absolute value Γ1 or the reflected wave power value pr1 is provided. Then, the frequency modulation control is performed in the second power supply ON period using the optimum value of the initial phase α and the optimum value of the frequency shift Fd obtained in the modulation parameter search process.

Although the example in which the initial phase α and the frequency shift Fd for reducing the reflection coefficient absolute value Γ1 (reflected wave power value pr1) are adjusted has been described above, the initial phase α and the frequency shift Fd may be adjusted so as to reduce the fluctuation range of the reflection coefficient ρ1 or the load-side impedance Z1 as described below.

In the modulation parameter search process described above, for example, as disclosed in JP 2022-102688 A, it is sufficient if when the initial phase α (in JP 2022-102688 A, "modulation start phase θ") is changed in the range of 0 to 360 degrees, the initial phase α in which the reflection coefficient absolute value Γ1 or the reflected wave power value pr1 is the smallest is searched for. That is, it is sufficient if the optimum value of the initial phase α is searched for. Hereinafter, such a process is referred to as an initial phase search process. In addition, it is sufficient if the frequency shift Fd in which the reflection coefficient absolute value Γ1 or the reflected wave power value pr1 becomes the smallest when the frequency shift Fd (in JP 2022-102688 A, "modulation amount gain A") is changed is searched for. That is, it is sufficient if the optimum value of the frequency shift Fd is searched for. Hereinafter, such a process is referred to as a frequency shift search process.

On the other hand, during the second power supply OFF period, the fundamental frequency of the first power supply 1 is constant at 40.18 MHZ. 40.18 MHz is a frequency (an example of the fundamental frequency F3) obtained by adding-0.5 MHz that is an offset frequency to 40.68 MHz that is the fundamental frequency F1. As described above, since the IMD does not occur during the second power supply OFF period, the frequency offset control is performed to decrease the reflection coefficient absolute value Γ1 or the reflected wave power value pr1 instead of not performing the frequency modulation control as in the second power supply ON period. In the example of FIG. 6, the offset frequency Fos is set to −0.5 MHz, but since the optimum offset frequency Fos varies depending on the situation, an offset frequency search process of searching for the optimum value of the offset frequency Fos based on the reflection coefficient absolute value Γ1 or the reflected wave power value pr1 is provided. Then, the frequency offset control is performed using the optimum value of the offset frequency Fos obtained in the offset frequency search process.

Figure 8:
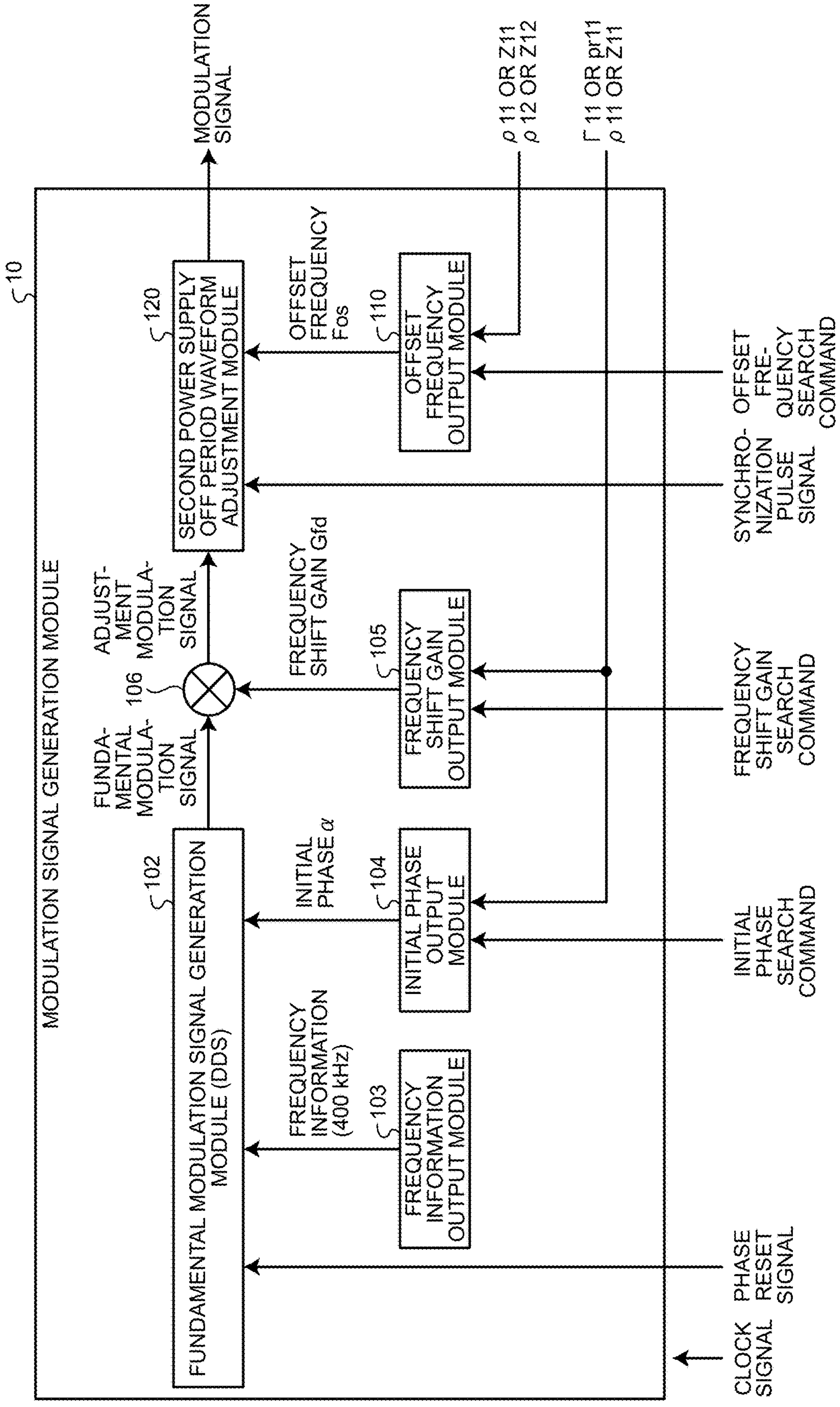
FIG. 8 is a diagram illustrating a configuration example of a modulation signal generation module.

Next, a configuration and the like of the modulation signal generation module 10 will be described with reference to FIG. 8. FIG. 8 is a diagram illustrating a configuration example of the modulation signal generation module 10. As illustrated in FIG. 8, the modulation signal generation module 10 includes a fundamental modulation signal generation module 102, a frequency information output module 103, an initial phase output module 104, a frequency shift gain output module 105, a multiplication module 106, an offset frequency output module 110, and a second power supply OFF period waveform adjustment module 120. A clock signal is also input to the modulation signal generation module 10, and processing is executed for each control cycle on the basis of the clock signal.

The fundamental modulation signal generation module 102 is an electronic circuit that generates a fundamental modulation signal that is a fundamental wave of the modulation signal. The fundamental modulation signal generation module 102 can use, for example, a direct digital synthesizer (DDS), and receives a clock signal, a phase reset signal, frequency information, and an initial phase α. As a result, the fundamental modulation signal generation module 102 outputs a desired sine wave signal as the fundamental modulation signal in each control cycle.

The frequency information is information indicating the frequency of the fundamental modulation signal. The frequency of the fundamental modulation signal is the same as the fundamental frequency F2 of the forward wave voltage VF2. In the case of the present embodiment, the frequency of the fundamental modulation signal is 400 kHz. In addition, the phase reset signal is output from the second matcher 4. The fundamental modulation signal generation module 102 resets the initial phase of the fundamental modulation signal to the initial phase α output from the initial phase output module 104 at the timing when the phase reset signal is input, and outputs a sine wave signal of a frequency (400 kHz) indicated by the frequency information as the fundamental modulation signal (see FIG. 5).

Note that the phase interval of the fundamental modulation signal output from the fundamental modulation signal generation module 102 varies depending on the control cycle of the first power supply 1. For example, when the first power supply 1 operates at a control cycle of 100 MHZ, because of 250 division (100 MHz/400 kHz), frequency information for each phase interval of 1.44 degrees (360 degrees/250) is output for each control cycle. When the first power supply 1 operates at a control cycle of 500 MHZ, because of 1250 division (500 MHz/400 kHz), frequency information for each phase interval of 0.288 degrees (360 degrees/1250) is output for each control cycle. The control cycle is set on the basis of a clock signal output from a system clock, which is not illustrated.

Object of Phase Reset Signal

Since the first power supply 1 and the second power supply 2 are different devices, the control cycle is determined based on different clock signals. In another clock signal, the cycle time of the clock signal is slightly different, and thus, there is a difference between the time recognized by the first power supply 1 and the time recognized by the second power supply 2. Therefore, every time the processing is executed, a difference between the time recognized by the first power supply 1 and the time recognized by the second power supply 2 accumulates and increases. This difference is preferably eliminated before it becomes too large.

Specifically, due to the difference in clock signal, there is a difference between the elapsed time from the start timing of the second power supply ON period recognized by the first power supply 1 and the elapsed time from the start timing of the second power supply ON period recognized by the second power supply 2. In this case, accurate control cannot be performed.

Therefore, the phase reset signal is input to the fundamental modulation signal generation module 102 of the first power supply 1 at a predetermined timing to eliminate the above difference.

As described above, since the phase reset signal is generated based on the detection signal of the forward wave voltage VF2 detected by the second matcher 4, the accumulation of the above difference does not occur. Accordingly, when the phase reset signal generated based on the detection signal of the forward wave voltage VF2 detected by the second matcher 4 is used, accurate control can be performed, and the effect of reducing the reflected wave power when the frequency modulation control is performed can be enhanced.

It is preferable that the fundamental modulation signal generation module 102 inputs the phase reset signal at least at the start timing of the second power supply ON period to eliminate the difference.

The initial phase output module 104 sets an initial phase α at which modulation of the fundamental modulation signal is to be started, and outputs the initial phase α toward the fundamental modulation signal generation module 102. Note that the initial phase α is a phase difference from a reference phase (for example, zero degrees). In addition, the initial phase output module 104 executes the initial phase search process when the initial phase search command is input. The optimum value of the initial phase α searched for in the initial phase search process is set as a new initial phase α. The initial phase output module 104 inputs information related to the reflection coefficient absolute value Γ1 or information related to the reflected wave power value pr1 in order to execute the initial phase search process. Then, the initial phase α is sequentially changed, and the initial phase α having the smallest reflection coefficient absolute value Γ1 or reflected wave power value pr1 is selected. Alternatively, the initial phase α may be sequentially changed, the reflection coefficient ρ1 or the load-side impedance Z1 may be acquired, and the optimum value of the initial phase α may be selected on the basis of the acquired reflection coefficient ρ1 or load-side impedance Z1.

In the frequency shift gain output module 105, a frequency shift gain Gfd for increasing or decreasing the frequency shift Fd of the fundamental modulation signal is set, and the set frequency shift gain Gfd is output toward the multiplication module 106. The frequency shift Fd is a frequency change width in the frequency modulation of the fundamental frequency F1 of the first power supply 1, and a setting range is determined based on the specification of the first power supply 1.

For example, when the specification of the frequency shift Fd of the first power supply 1 is ±1.2 MHZ at the maximum with respect to the fundamental frequency F1, the frequency shift gain Gfd is set such that a processing result in the multiplication module 106 described below falls within the above range. In the present embodiment, since the frequency shift Fd of the fundamental modulation signal is set to ±1 MHz as illustrated in FIG. 5, the frequency shift gain Gfd is set at a magnification with respect to ±1 MHZ. For example, when the frequency modulation range of the fundamental frequency F1 of the first power supply 1 is set to ±1.2 MHz, it is sufficient if the frequency shift gain Gfd is set to 1.2.

In addition, the frequency shift gain output module 105 executes the frequency shift search process when a frequency shift gain search command is input. The optimum value of the frequency shift gain Gfd searched for in the frequency shift search process is set as a new frequency shift gain Gfd. The frequency shift gain output module 105 inputs the reflection coefficient absolute value Γ1 or the reflected wave power value pr1 in order to execute the frequency shift search process. Then, the initial phase α is sequentially changed, and the frequency shift gain Gfd having the smallest reflection coefficient absolute value Γ1 or reflected wave power value pr1 is selected.

Alternatively, the frequency shift gain Gfd may be sequentially changed, the reflection coefficient ρ1 or the load-side impedance Z1 may be acquired, and the frequency shift Fd or the frequency shift gain Gfd may be selected on the basis of the acquired reflection coefficient ρ1 or load-side impedance Z1.

Note that although the example in which the frequency shift gain Gfd is searched for has been described above, the frequency shift Fd may be searched for. However, in the present embodiment, since the frequency shift Fd of the fundamental modulation signal is set to ±1 MHz as illustrated in FIG. 5, when the frequency shift Fd is searched for, it is sufficient if a value converted into the frequency shift gain Gfd is output to the multiplication module 106 described below. For example, when the optimum value of the frequency shift Fd is 1.2 MHz, it is assumed that the optimum value of the frequency shift gain Gfd is 1.2, and it is sufficient if the frequency shift gain Gfd=1.2 is output to the multiplication module 106.

The multiplication module 106 multiplies the frequency information indicated by the fundamental modulation signal by the frequency shift gain Gfd in each control cycle, and outputs the multiplication result to the second power supply OFF period waveform adjustment module 120 as an adjustment modulation signal in each control cycle. The frequency shift Fd of the fundamental frequency F1 of the first power supply 1 is determined by the processing in the multiplication module 106.

In the offset frequency output module 110, offset frequency information for offsetting frequency information in the second power supply OFF period is set. The information of the offset frequency Fos is output to the second power supply OFF period waveform adjustment module 120. In the present embodiment, as illustrated in FIG. 6, the offset frequency Fos is set to −0.5 MHZ.

In addition, when an offset frequency search command is input, the offset frequency output module 110 executes the offset frequency search process. The optimum value of the offset frequency Fos searched for in the offset frequency search process is set as a new offset frequency Fos. The offset frequency output module 110 inputs the reflection coefficient absolute value Γ1 or the reflected wave power value pr1 in order to execute the offset frequency search process. Then, the offset frequency Fos is sequentially changed, and the offset frequency Fos having the smallest reflection coefficient absolute value Γ1 or reflected wave power value pr1 is selected.

Alternatively, in order to execute the offset frequency search process, the offset frequency output module 110 inputs the average value of the reflection coefficient ρ11 or the load-side impedance Z11 at the output end of the first power supply 1 calculated in the second power supply ON period and the average value of the reflection coefficient ρ12 or the load-side impedance Z12 at the output end of the first power supply 1 calculated in the second power supply OFF period, and selects the offset frequency Fos having the smallest difference between the two.

The second power supply OFF period waveform adjustment module 120 inputs the frequency information indicated by the adjustment modulation signal, the synchronization pulse signal, and the information of the offset frequency Fos output from the offset frequency output module 110 for each control cycle. The adjustment modulation signal is a signal obtained by applying the initial phase α and the frequency shift Fd to the fundamental modulation signal illustrated in FIG. 5, but there is no distinction between the second power supply ON period and the second power supply OFF period, and the offset frequency Fos is not applied. Therefore, the second power supply ON period and the second power supply OFF period are distinguished from each other using the synchronization pulse signal and the information of the offset frequency Fos, and the offset frequency Fos is applied. As a result, the modulation signal illustrated in FIG. 6 can be generated.

Flowchart

The frequency modulation control and the frequency offset control of the first power supply 1 will be further described below with reference to flowcharts.

Figure 9:
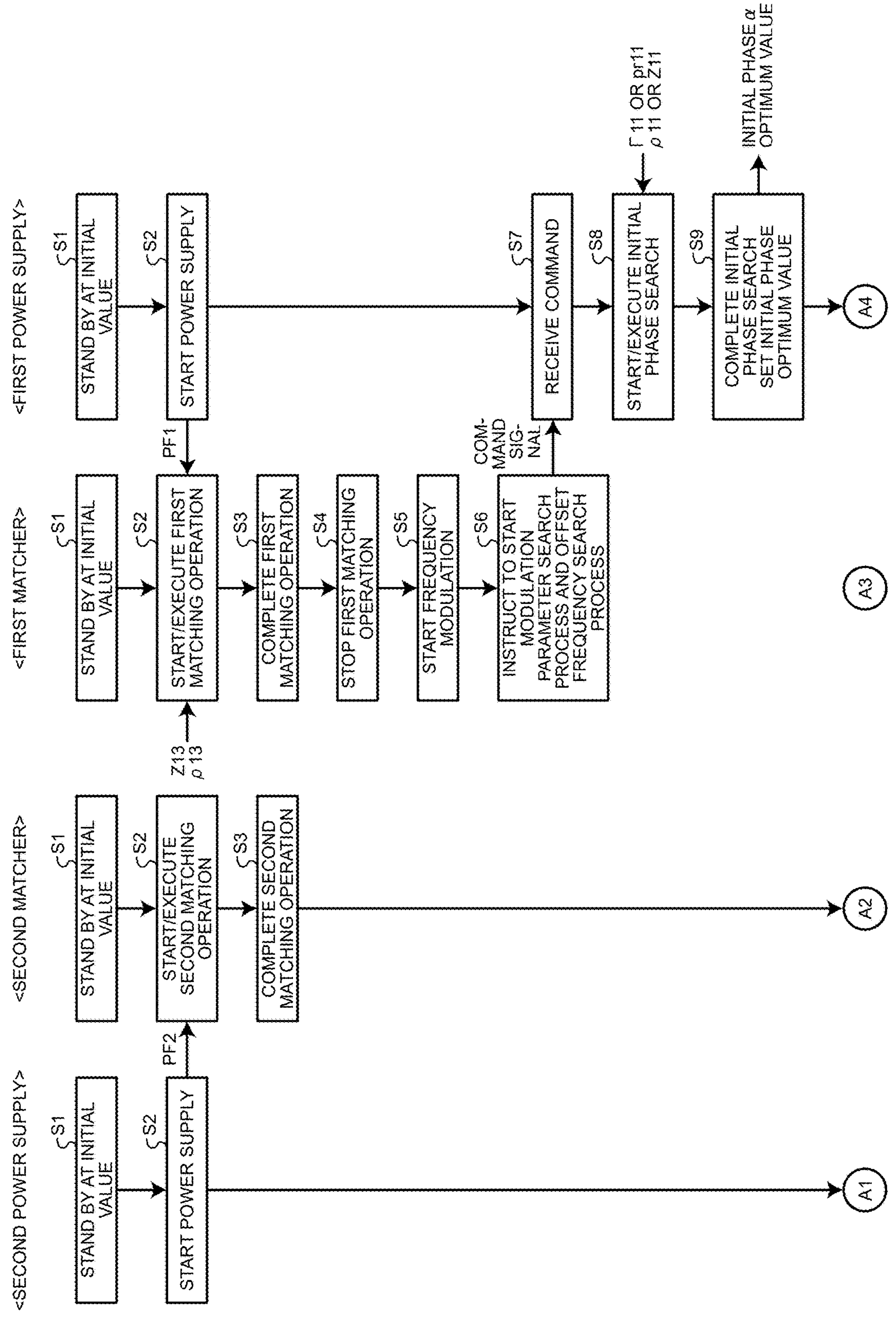
FIG. 9 is a diagram illustrating an example (part 1) of a flowchart when frequency modulation control and frequency offset control are performed.
Figure 10:
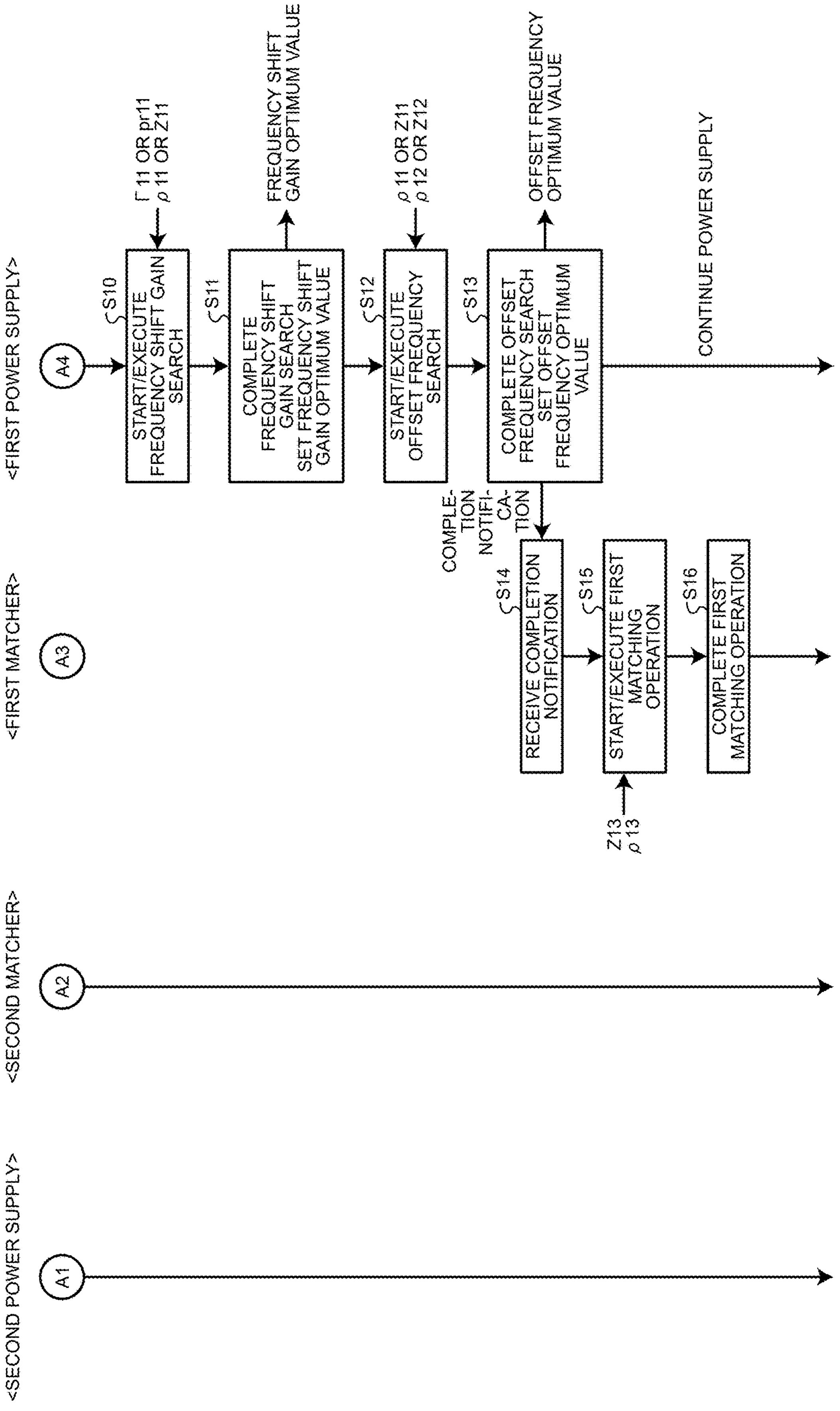
FIG. 10 is a diagram illustrating an example (part 2) of a flowchart when frequency modulation control and frequency offset control are performed.

FIGS. 9 to 10 are diagrams illustrating an example of a flowchart when frequency modulation control and frequency offset control are performed. Note that FIGS. 9 to 10 illustrate a series of processes divided into four. In addition, in each drawing, the processes are illustrated from the top to the bottom in the order of the second power supply 2, the second matcher 4, the first matcher 3, and the first power supply 1 from the left side. In addition, it is assumed that the second power supply ON period and the second power supply OFF period are the same time.

In Step S1, the first power supply 1, the second power supply 2, the first matcher 3, and the second matcher 4 stand by at initial values.

In Step S2, the supply of the forward wave power PF1 from the first power supply 1 to the load is started, and the supply of the forward wave power PF2 from the second power supply 2 to the load is started. This power supply is continued thereafter. As a result, the first matching operation is started in the first matcher 3, and the second matching operation is started in the second matcher 4. At this time, the first matcher 3 performs the first matching operation based on the reflection coefficient ρ13 or the load-side impedance Z13 in both the second power supply ON period and the second power supply OFF period. That is, the matching operation by the weighted average is performed.

The first matcher 3 and the second matcher 4 each perform a matching operation to reduce the reflected wave power to the maximum. As a result, as indicated in Step S3, each matching operation is completed.

Figure 11:
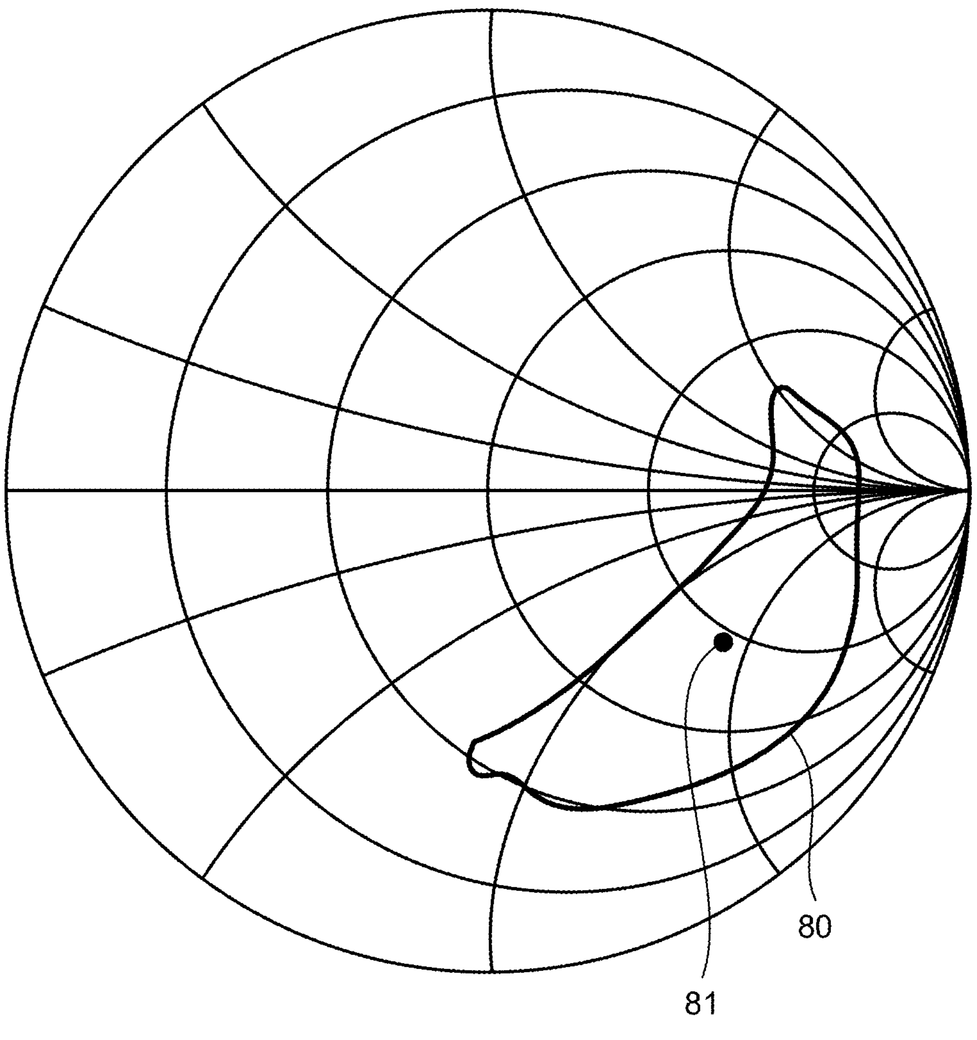
FIG. 11 is a diagram illustrating an example (part 1) of reflection coefficient or load-side impedance.

FIG. 11 is a diagram illustrating an example of a locus 80 and its center 81 of the reflection coefficient ρ1 or the load-side impedance Z1 at the completion of Step S3 on a Smith chart. As illustrated in this example, the reflection coefficient ρ1 or the load-side impedance Z1 varies within a certain range. Therefore, the center 81 of the locus 80 of the reflection coefficient ρ1 or the load-side impedance Z1 is considered as a representative value, and the center 81 is controlled to approach the center of the Smith chart.

In addition, as illustrated in FIG. 11, at this stage, the fluctuation range of the reflection coefficient ρ13 or the load-side impedance Z13 is wide, and the center 81 of the locus 80 is away from the center of the Smith chart.

The second power supply 2 is configured to perform pulse modulation that repeats the ON operation of outputting the forward wave voltage VF2 and the OFF operation of not outputting the forward wave voltage VF2 at a predetermined cycle, the IMD occurs in the second power supply ON period, and the reflected wave power PR1 on the first power supply 1 side increases.

At this point, the frequency modulation control is not performed, and the initial phase α, the frequency shift Fd (set by the frequency shift gain Gfd), and the offset frequency Fos are not appropriate. Therefore, the modulation parameter search process and the offset frequency search process are executed in order to obtain the optimum values of these parameters. Note that the modulation parameter search process includes the initial phase search process and the frequency shift search process.

As indicated in Step S4, the first matching operation in the first matcher 3 is stopped. As a result, the first matcher 3 maintains the variable value of the variable element without changing the variable value. In addition, as indicated in Step S5, the start of frequency modulation is determined. Thereafter, as indicated in Step S6, the first matcher 3 instructs the first power supply 1 to start the modulation parameter search process and the offset frequency search process.

As indicated in Step S7, after receiving this command, the first power supply 1 performs an operation of searching for an optimum value of the initial phase α as indicated in Step S8. At this time, the first power supply 1 executes the initial phase search process based on the reflection coefficient absolute value Γ11 or the reflected wave power value pr11 in the second power supply ON period. Alternatively, the first power supply 1 may execute the initial phase search process based on the reflection coefficient ρ11 or the load-side impedance Z11 in the second power supply ON period.

As indicated in Step S9, when the search for the optimum value of the initial phase α is completed, the first power supply 1 sets the optimum value of the initial phase α as a new initial phase α.

Figure 12:
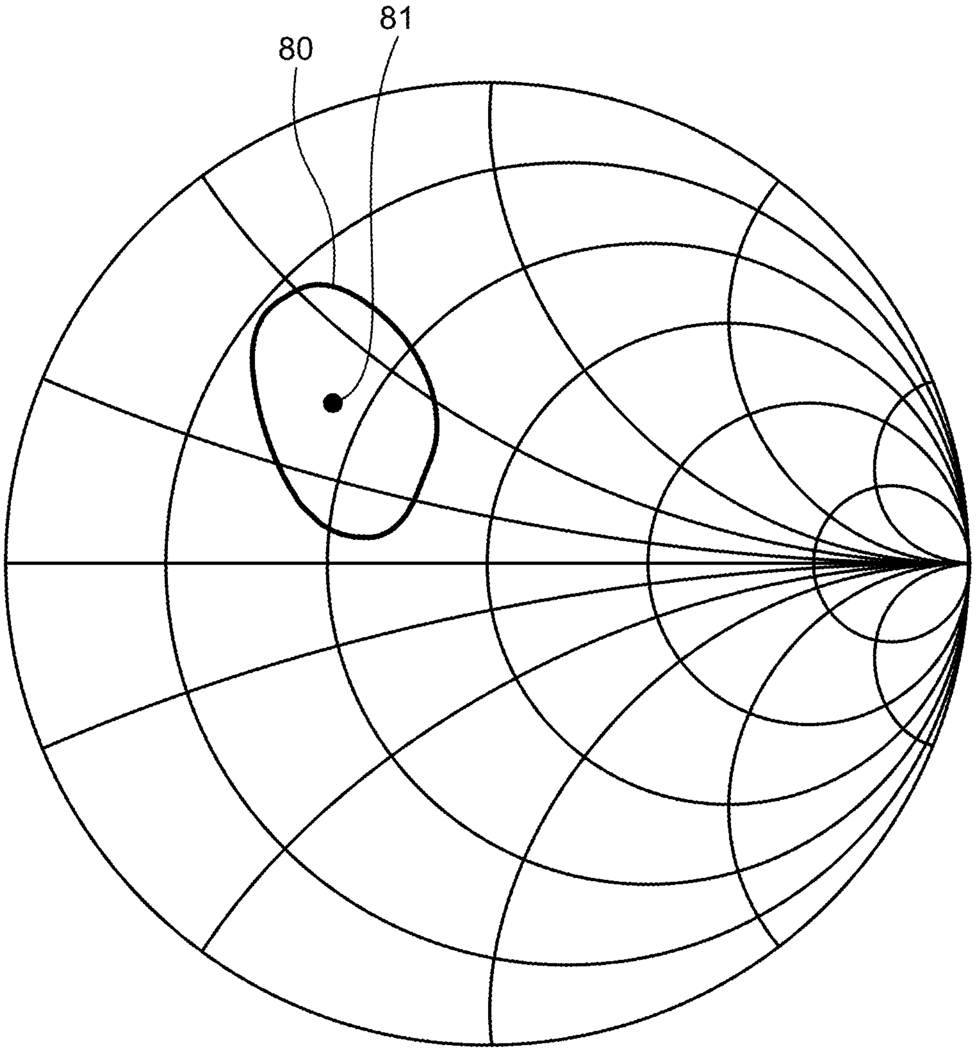
FIG. 12 is a diagram illustrating an example (part 2) of reflection coefficient or load-side impedance.

FIG. 12 is a diagram illustrating an example of the locus 80 and its center 81 of the reflection coefficient ρ1 or the load-side impedance Z1 at the completion of Step S9 on a Smith chart. As illustrated in this example, by changing the initial phase α to the optimum value, the position of the center 81 of the locus 80 changes, and the fluctuation range of the locus 80 decreases. Of course, the change from FIG. 11 to FIG. 12 is an example for describing the present embodiment in an easy-to-understand manner, and the actual locus 80 changes to various shapes depending on the situation of the load or the like.

Thereafter, as indicated in Step S10, the first power supply 1 performs an operation of searching for an optimum value of the frequency shift gain Gfd. At this time, the first power supply 1 executes the frequency shift search process based on the reflection coefficient absolute value Γ11 or the reflected wave power value pr11 in the second power supply ON period. As described above, the first power supply 1 may execute the initial phase search process based on the reflection coefficient ρ11 or the load-side impedance Z11 in the second power supply ON period.

Figure 13:
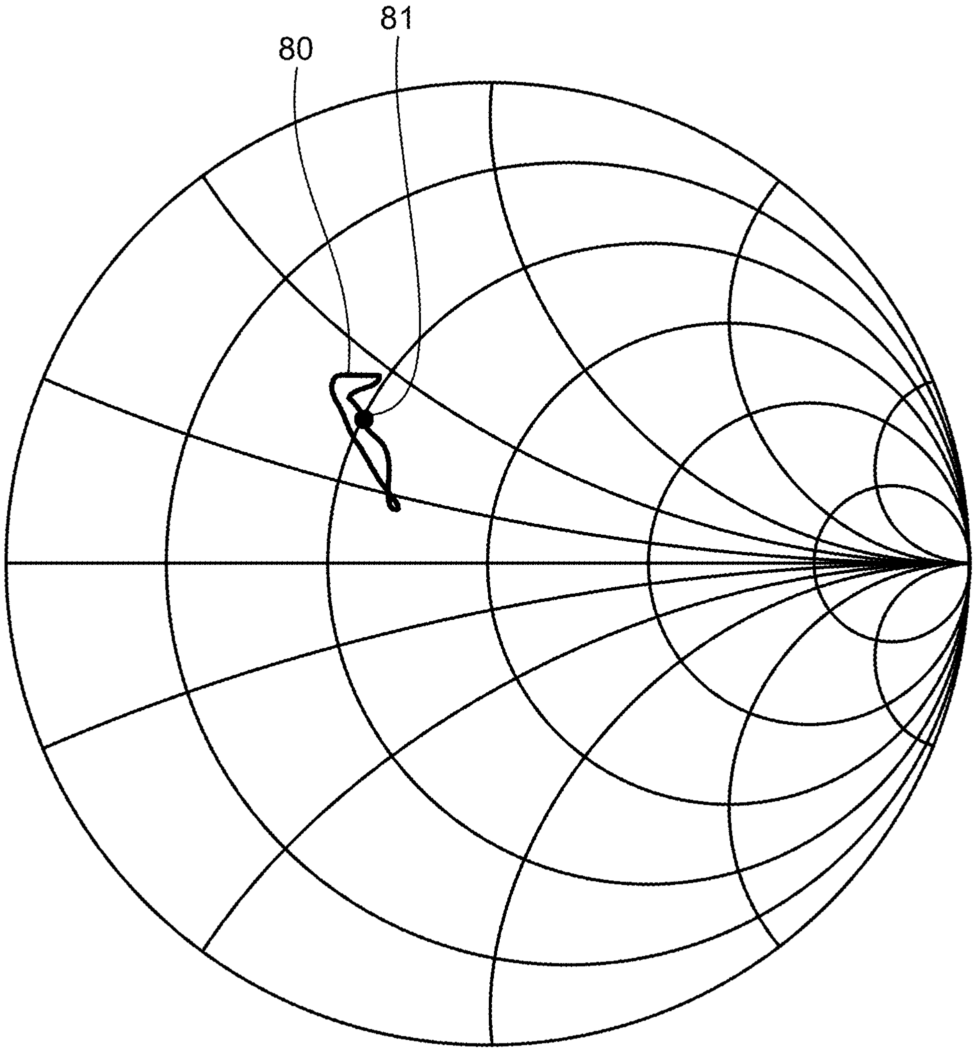
FIG. 13 is a diagram illustrating an example (part 3) of reflection coefficient or load-side impedance.

As indicated in Step S11, when the search for the optimum value of the frequency shift gain Gfd is completed, the first power supply 1 sets the optimum value of the frequency shift gain Gfd as a new frequency shift gain Gfd. FIG. 13 is a diagram illustrating an example of the locus 80 and its center 81 of the reflection coefficient ρ1 or the load-side impedance Z1 at the completion of Step S11 on a Smith chart. As illustrated in this example, the fluctuation range of the locus 80 is reduced by changing the frequency shift gain Gfd to the optimum value. Of course, the change from FIG. 12 to FIG. 13 is an example for describing the present embodiment in an easy-to-understand manner, and the actual locus 80 changes to various shapes depending on the situation of the load or the like.

Regarding Relationship between Initial Phase Search Process and Frequency Shift Search Process, and Frequency Modulation Control Here, a relationship between the initial phase search process and the frequency shift search process, and the frequency modulation control will be described. As described above, the frequency modulation control is performed when the initial phase α is searched for in the initial phase search process. In addition, in the present embodiment, the first power supply 1 performs frequency modulation control of modulating the forward wave voltage VF1 with a modulation signal having the same frequency (400 kHz in the present embodiment) as the fundamental frequency F2 in the second power supply ON period. Therefore, when the initial phase α is changed, it is sufficient if the value is changed every cycle time of the fundamental frequency F2 (2.5 us in the present embodiment).

For example, the initial phase α is set to zero degrees, and the reflection coefficient absolute value Γ1 or the reflected wave power value pr1 for 2.5 μs is acquired. Thereafter, the initial phase α is set to 1 degree, and the reflection coefficient absolute value Γ1 or the reflected wave power value pr1 for 2.5 μs is acquired. It is sufficient if such processing is performed every time the initial phase α is changed in the change range of the initial phase α (for example, 0 to 360 degrees) (for example, every 1 degree). In this way, for each initial phase α, the reflection coefficient absolute value Γ1 or the reflected wave power value pr1 considering the fluctuation of one cycle of frequency modulation can be acquired. Of course, it is not limited to the above, and when the initial phase α is changed, the initial phase α may be changed every integer multiple of the cycle time of the fundamental frequency F2 (every integer multiple of 2.5 μs in the present embodiment). In addition, for example, an average value may be calculated for the acquired reflection coefficient absolute value Γ1 or reflected wave power value pr1, and the calculated average value may be set as the reflection coefficient absolute value Γ1 or the reflected wave power value pr1 for each initial phase α.

By calculating the average value, the average value of the reflection coefficient absolute value Γ1 or the reflected wave power value pr1 in one cycle of frequency modulation can be acquired. That is, the reflection coefficient absolute value Γ1 or the reflected wave power value pr1 corresponding to the center 81 of the locus 80 of the reflection coefficient ρ1 or the load-side impedance Z1 described below with reference to FIG. 11 and the like can be acquired.

Of course, when the initial phase α is changed, it is not essential to change the initial phase α every integer multiple of the cycle time of the fundamental frequency F2. For example, the initial phase α may be changed every time sufficiently longer than the cycle time of the fundamental frequency F2 (for example, about 100 times the cycle time of the fundamental frequency F2). Since it is not an integer multiple of the cycle time of the fundamental frequency F2, an error occurs, but since it is sufficiently longer than the cycle time of the fundamental frequency F2, the error is small and practically acceptable. In addition, by setting the time sufficiently longer than the cycle time of the fundamental frequency F2, there is an advantage that the stability at the time of acquiring the reflection coefficient absolute value Γ1 or the reflected wave power value pr1 corresponding to the center 81 of the locus 80 of the reflection coefficient ρ1 or the load-side impedance Z1 is enhanced. On the other hand, when the time is longer than the cycle time of the fundamental frequency F2, the time for searching for the initial phase α becomes longer, and therefore, it is sufficient if an appropriate time is set according to the use situation.

Note that the average value may be a moving average value. In this case, it is sufficient if the moving average value is calculated and output at predetermined time intervals (for example, every control cycle).

In addition, when the frequency shift Fd or the frequency shift gain is searched for in the frequency shift search process, similarly to the initial phase search process, it is sufficient if the frequency shift Fd or the frequency shift gain Gfd is changed every integer multiple of the cycle time of the fundamental frequency F2 (every integer multiple of 2.5 μs in the present embodiment). In addition, an average value (for example, a moving average value) may be calculated for the acquired reflection coefficient absolute value Γ1 or reflected wave power value pr1, and the calculated average value (for example, a moving average value) may be set as the reflection coefficient absolute value Γ1 or the reflected wave power value pr1 for each frequency shift Fd or frequency shift gain Gfd.

In addition, similarly to the initial phase search process described above, when the frequency shift Fd or the frequency shift gain Gfd is changed, it is not essential to change the initial phase α every integer multiple of the cycle time of the fundamental frequency F2.

Regarding Information Acquired in Initial Phase Search Process and Frequency Shift Search Process In the above example, the reflection coefficient absolute value Γ1 or the reflected wave power value pr1 is acquired in the initial phase search process and the frequency shift search process, and the initial phase α and the frequency shift Fd or the frequency shift gain Gfd are searched for based on the acquired reflection coefficient absolute value Γ1 or reflected wave power value pr1, but it is not limited to this example.

For example, the reflection coefficient ρ1 or the load-side impedance Z1 may be acquired, and the initial phase α and the frequency shift Fd or the frequency shift gain Gfd may be searched for on the basis of the acquired reflection coefficient ρ1 or load-side impedance Z1.

In this case, the initial phase α searched for in the initial phase search process is an initial phase α in which the average value of the absolute values of the differences between the average value of the reflection coefficient ρ1 or the load-side impedance Z1 at the output end of the first power supply 1 acquired for each initial phase α to be searched for and the instantaneous value of the reflection coefficient ρ1 or the load-side impedance Z1 at the output end of the first power supply 1 acquired for each initial phase α to be searched for is minimum.

Here, the average value of the reflection coefficient ρ1 or the load-side impedance Z1 at the output end of the first power supply 1 acquired for each initial phase α to be searched for corresponds to the center 81 of the locus 80 of the reflection coefficient ρ1 or the load-side impedance Z1. Therefore, the average value of the absolute values of the differences between the average value and the instantaneous value of the reflection coefficient ρ1 or the load-side impedance Z1 at the output end of the first power supply 1 acquired for each initial phase α to be searched for represents the magnitude of the fluctuation range of the reflection coefficient ρ1 or the load-side impedance Z1. Therefore, searching for the initial phase α in which the average value of the differences is minimum means that the fluctuation range of the locus 80 of the reflection coefficient ρ1 or the load-side impedance Z1 is small, and thus, means that the reflection coefficient ρ1 when the first matching operation is executed by the first matcher thereafter and the center 81 of the locus 80 is moved to the center or the vicinity of the center of the Smith chart becomes small. Therefore, it is effective to search for the initial phase α by the above method.

In addition, the frequency shift Fd or the frequency shift gain Gfd to be searched for in the frequency shift search process may be the frequency shift Fd or the frequency shift gain Gfd at which the average value of the absolute values of the differences between the average value of the reflection coefficient or the load-side impedance at the output end of the first power supply acquired for each frequency shift Fd or frequency shift gain Gfd to be searched for and the instantaneous value of the reflection coefficient or the load-side impedance at the output end of the first power supply acquired for each frequency shift Fd to be searched for is minimum.

In this case, similarly to the initial phase search process, searching for the frequency shift Fd or the frequency shift gain Gfd at which the average value of the differences is minimum means that the fluctuation range of the locus 80 of the reflection coefficient ρ1 or the load-side impedance Z1 is small, and thus, means that the reflection coefficient ρ1 when the first matching operation is executed by the first matcher thereafter and the center 81 of the locus 80 is moved to the center or the vicinity of the center of the Smith chart becomes small. Therefore, it is effective to search for the frequency shift Fd or the frequency shift gain Gfd by the above method.

In addition, in the initial phase search process, the reflection coefficient absolute value Γ1 or the reflected wave power value pr1 may be acquired, and the initial phase α may be searched for based on the acquired reflection coefficient absolute value Γ1 or reflected wave power value pr1, and in the frequency shift search process, the reflection coefficient ρ1 or the load-side impedance Z1 may be acquired, and the frequency shift Fd or the frequency shift gain Gfd may be searched for based on the acquired reflection coefficient ρ1 or load-side impedance Z1.

In addition, in the initial phase search process, the reflection coefficient ρ1 or the load-side impedance Z1 may be acquired, and the initial phase α may be searched for based on the acquired reflection coefficient ρ1 or load-side impedance Z1, and in the frequency shift search process, the reflection coefficient absolute value Γ1 or the reflected wave power value pr1 may be acquired, and the frequency shift Fd or the frequency shift gain Gfd may be searched for based on the acquired reflection coefficient absolute value Γ1 or reflected wave power value pr1.

Thereafter, as indicated in Step S12, the first power supply 1 performs an operation of searching for an optimum value of the offset frequency Fos. At this time, the first power supply 1 executes the offset frequency search process based on the reflection coefficient ρ12 or the load-side impedance Z12 in the second power supply OFF period.

As indicated in Step S13, when the search for the optimum value of the offset frequency Fos is completed, the first power supply 1 sets the optimum value of the offset frequency Fos as a new offset frequency Fos. At the same time, the first power supply 1 notifies the first matcher 3 that the offset frequency search process has been completed. Note that the first power supply 1 continues the supply of the forward wave power PF1 to the load.

As indicated in Step S14, when the first matcher 3 receives the completion notification, the first matcher 3 starts the first matching operation as indicated in Step S15. At this time, the first matcher 3 performs the first matching operation based on the reflection coefficient ρ13 or the load-side impedance Z13 in both the second power supply ON period and the second power supply OFF period. That is, the matching operation by the weighted average is performed.

The first matcher 3 attempts to reduce the reflected wave power to the maximum. As a result, as indicated in Step S16, the matching operation is completed. Note that the first matcher 3 continues the first matching operation, and performs an operation of reducing the reflected wave power in a case where the reflection coefficient absolute value that can be calculated from the reflection coefficient ρ13 or the load-side impedance Z13 is larger than a predetermined threshold.

In addition, in the second power supply OFF period, the first matcher 3 preferably does not change but maintains the variable value of the variable element adjusted by the first matching operation in the second power supply ON period. In this way, the frequency offset control can be stably performed.

Figure 14:
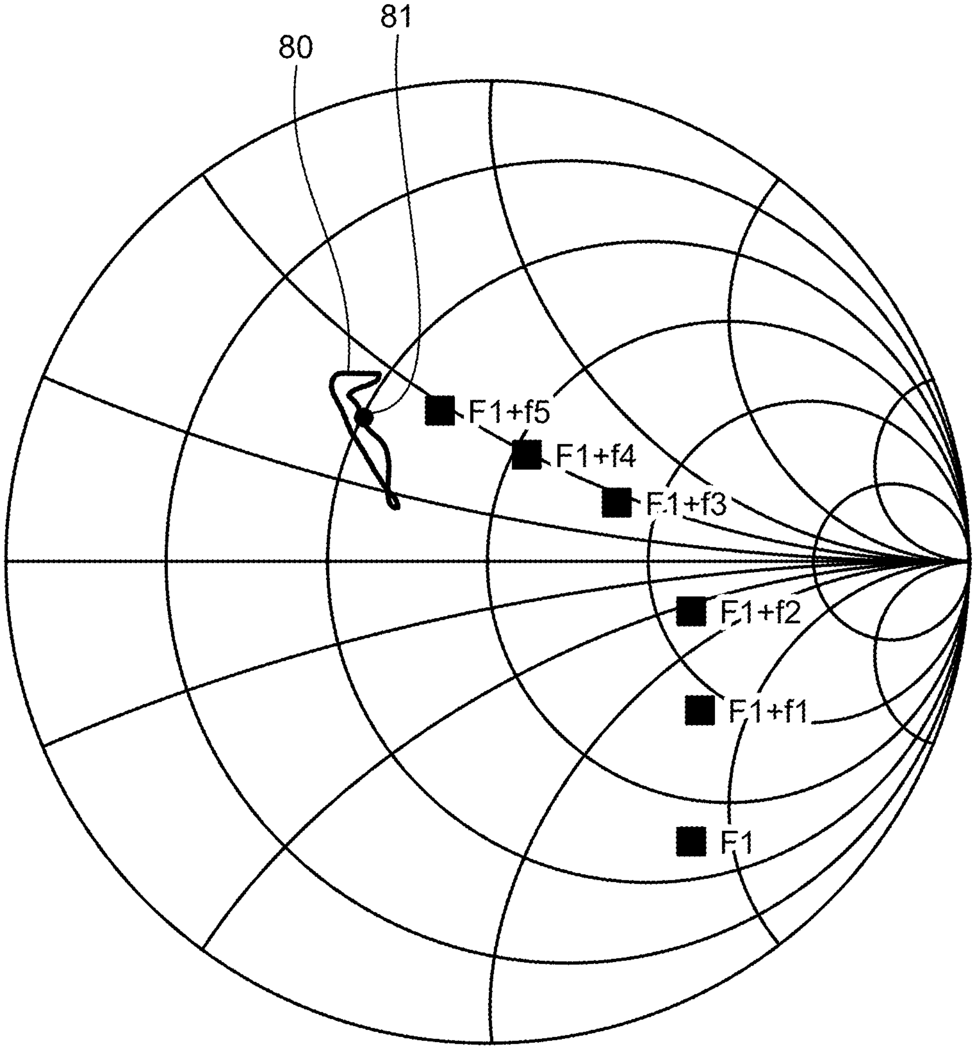
FIG. 14 is a diagram for describing an offset frequency search process.

Here, the offset frequency search process described above will be further described. FIG. 14 is a diagram for describing an offset frequency search process. When the forward wave voltage VF1 is output from the first power supply 1 in the second power supply OFF period at the time point when the offset frequency search process is started, the reflection coefficient ρ12 or the load-side impedance Z12 is, for example, as illustrated in "F1" in FIG. 14.

In FIGS. 14, f1, f2, f3, f4, and f5 are examples of the candidates of the offset frequency Fos. In addition, F1, F1+f1, F1+f2, F1+f3, F1+f4, and F1+f5 represent the fundamental frequency F3 obtained by adding the candidates of the offset frequency Fos to the fundamental frequency F1. Note that F1 in FIG. 14 is the fundamental frequency F3 in the case where there is no offset frequency Fos (in the case of 0 MHZ).

Under such conditions, in the second power supply OFF period, F1, F1+f1, F1+f2, F1+f3, F1+f4, and F1+f5 are sequentially set as the fundamental frequency F3. Then, when the forward wave voltage VF3 having the fundamental frequency F3 is output from the first power supply 1, the reflection coefficient ρ12 or the load-side impedance Z12 (both indicated by black squares) in the second power supply OFF period changes as illustrated in FIG. 14, for example, in accordance with a change in fundamental frequency F3.

In the example illustrated in FIG. 14, when the fundamental frequency F3 is F1+f5, that is, when the offset frequency Fos is f5, the reflection coefficient ρ12 or the load-side impedance Z12 is closest to the center 81 (indicated by the black circle) of the locus 80 of the reflection coefficient ρ11 or the load-side impedance Z11. Therefore, it is sufficient if f5 is adopted as the offset frequency Fos.

Here, the gist of the offset frequency search process will be described. The object of the offset frequency search process is to search for the offset frequency Fos for reducing the reflected wave power in the second power supply OFF period, but it is necessary to consider not only the second power supply OFF period but also the relationship with the second power supply ON period. Specifically, after the frequency modulation parameter search process and the offset frequency search process are completed, processing using the initial phase α, the frequency shift Fd (frequency shift gain Gfd), and the offset frequency Fos determined in these processes is performed. At this time, as indicated in Step S15, the first matcher 3 performs the matching operation by the weighted average. Therefore, it is desirable that a difference between the reflection coefficient ρ11 or the load-side impedance Z11 in the second power supply ON period and the reflection coefficient ρ12 or the load-side impedance Z12 in the second power supply OFF period be small.

Therefore, when the fundamental frequency F3 is expressed as the fundamental frequency F1+the offset frequency Fos, it is sufficient if the offset frequency Fos at which the difference between the reflection coefficient ρ11 corresponding to the center 81 of the locus 80 during the second power supply ON period and the reflection coefficient ρ12 during the second power supply OFF period is the smallest is searched for, or the offset frequency Fos at which the difference between the load-side impedance Z11 corresponding to the center 81 of the locus 80 during the second power supply ON period and the load-side impedance Z12 during the second power supply OFF period is the smallest is searched for. Then, the fundamental frequency F3 in the second power supply OFF period is set.

In the case of the present embodiment, since the difference between the reflection coefficient ρ11 or the load-side impedance Z11 corresponding to the center 81 of the locus 80 illustrated in FIG. 14 and the reflection coefficient ρ12 or the load-side impedance Z12 when the fundamental frequency F3 is F1+f5 is the smallest, it is sufficient if f5 is adopted as the offset frequency Fos.

Figure 15:
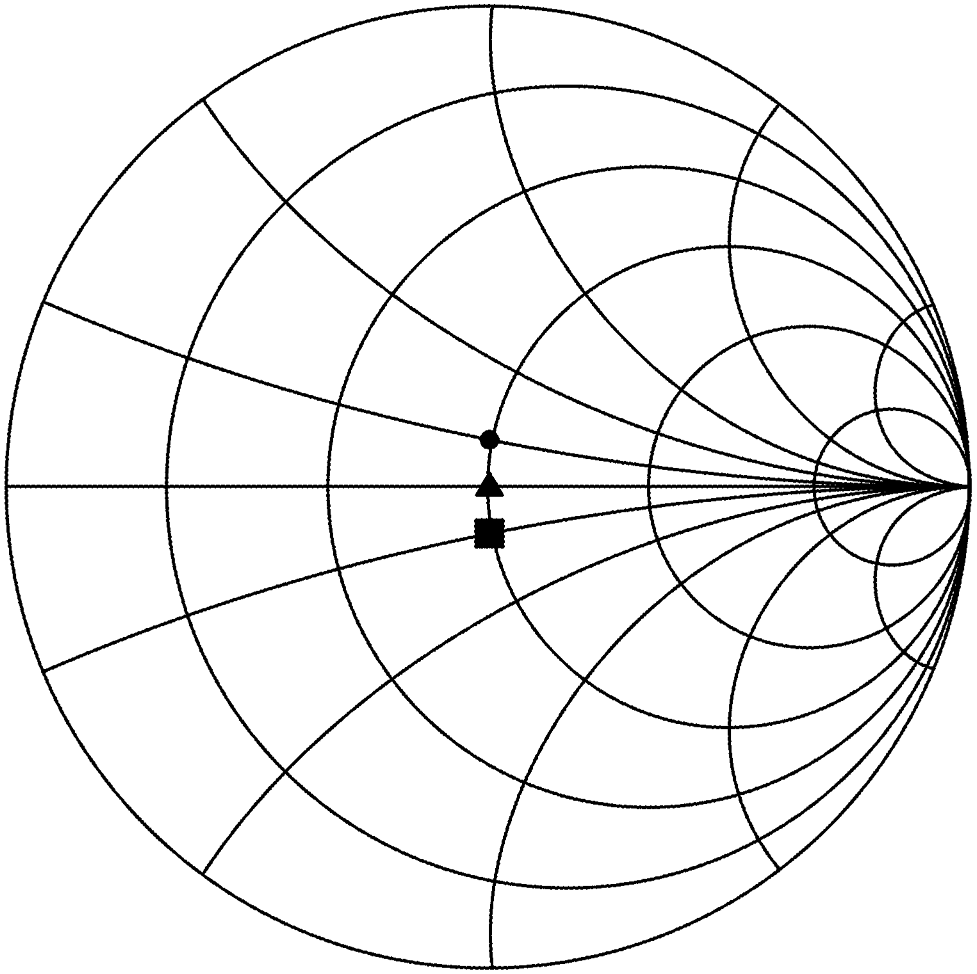
FIG. 15 is a diagram illustrating an example of reflection coefficient or load-side impedance when a first matching operation is executed after the offset frequency search process is completed.

FIG. 15 is a diagram illustrating an example of load-side impedance when a first matching operation is executed after the offset frequency search process is completed. In FIG. 15, the black circle indicates the center 81 of the locus 80 of the reflection coefficient ρ11 or the load-side impedance Z11, the black square indicates the reflection coefficient ρ12 or the load-side impedance Z12, and the black triangle indicates the reflection coefficient ρ13 or the load-side impedance Z13.

Note that, at this time point, because the optimum values of the initial phase α, the frequency shift Fd (frequency shift gain Gfd), and the offset frequency Fos are applied, the frequency modulation control is accurately performed during the second power supply ON period, and the frequency offset control is accurately performed during the second power supply OFF period.

In addition, at this stage, the matching operation by the weighted average is performed. In the present embodiment, since the second power supply ON period and the second power supply OFF period are the same time, the black triangle indicating the load-side impedance Z13 illustrated in FIG. 15 is controlled to be the center position of the Smith chart.

As described above, the optimum values of the initial phase α and the frequency shift Fd (frequency shift gain Gfd) necessary for the frequency modulation control and the offset frequency Fos necessary for the offset frequency control are acquired, and these parameters are applied, whereby the reflected wave power can be reduced to the maximum.

At this time, the difference between the load-side impedance Z11 during the second power supply ON period and the load-side impedance Z12 during the second power supply OFF period can be reduced. The same idea can be applied to the reflection coefficient ρ1, and the difference between the reflection coefficient ρ11 during the second power supply ON period and the reflection coefficient ρ12 during the second power supply OFF period can be reduced. That is, with the high-frequency power supply system 90 of the present embodiment, the power value of the reflected wave power on the first power supply side can be reduced in both periods: the second power supply ON period and the second power supply OFF period. That is, the absolute value of the reflection coefficient on the first power supply side can be reduced.

Note that at the completion of Step S9 and the completion of Step S11, the first matcher 3 can also perform the first matching operation based on the reflection coefficient ρ11 or the load-side impedance Z11 in the second power supply ON period. In this way, after the completion of the first matching operation, the center 81 of the locus 80 can be set to the center (or the vicinity of the center) of the Smith chart.

In the present embodiment, after performing the first matching operation for the first time in Step S2, the first matcher 3 only needs to perform the first matching operation for the second time in Step S15, so that the optimum values of the initial phase, the frequency shift Fd (frequency shift gain Gfd), and the offset frequency Fos can be obtained in a shorter time.

Note that when the reflection coefficient absolute value that can be calculated from the reflection coefficient ρ13 or the load-side impedance Z13 is larger than the predetermined threshold even though Step S16 is executed, the initial phase search process, the frequency shift search process, and the offset frequency search process may be performed again to reduce the reflection coefficient absolute value. Alternatively, an arbitrary process among the initial phase search process, the frequency shift search process, and the offset frequency search process may be performed to reduce the reflection coefficient absolute value.

According to the high-frequency power supply system of the present disclosure, the power value of the reflected wave power on the first power supply side can be reduced in both periods: the second power supply ON period and the second power supply OFF period. That is, the absolute value of the reflection coefficient on the first power supply side can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Supplementary Note

The present invention is also applicable to other aspects as described below.

[First Another Aspect]

A first another aspect is a method of controlling a high-frequency power supply system, wherein the high-frequency power supply system includes:

a second power supply that is capable of outputting a second forward wave voltage having a second fundamental frequency lower than a predetermined first fundamental frequency, and performs pulse modulation of repeating an ON operation of outputting the second forward wave voltage and an OFF operation of not outputting the second forward wave voltage;

a first power supply that is capable of outputting a first forward wave voltage having the first fundamental frequency, and performs frequency modulation control to frequency-modulate the first forward wave voltage with a modulation signal having a same frequency as the second fundamental frequency in a second power supply ON period in which the ON operation is performed, and performs frequency offset control to output a third forward wave voltage having a third fundamental frequency obtained by adding an offset frequency to the first fundamental frequency in a second power supply OFF period in which the OFF operation is performed; and a first matcher that is connected between the first power supply and a load and performs a first matching operation of matching an impedance on a first power supply side with an impedance on a load side, the method includes:

causing the first matcher to perform the first matching operation after power supply from the first power supply and the second power supply to the load is started, and stopping the first matching operation when the first matching operation is completed;

searching for an initial phase of the modulation signal in which a reflection coefficient or load-side impedance at an output end of the first power supply calculated in the second power supply ON period is optimum within a search range in a state where the first matching operation in the first matcher is stopped;

searching for a frequency shift or a frequency shift gain in which the reflection coefficient or the load-side impedance at the output end of the first power supply calculated in the second power supply ON period is optimum within the search range in the state where the first matching operation in the first matcher is stopped; and searching for an offset frequency at which a reflection coefficient or load-side impedance at the output end of the first power supply calculated in the second power supply OFF period is optimum within the search range in the state where the first matching operation in the first matcher is stopped, the initial phase of the modulation signal for optimization within the search range is an initial phase in which an average value of absolute values of differences between an average value of reflection coefficients or load-side impedances at the output end of the first power supply acquired for initial phases to be searched for and instantaneous values of the reflection coefficients or the load-side impedances at the output end of the first power supply acquired for the initial phases to be searched for is minimum, or an initial phase of the modulation signal in which a reflection coefficient absolute value or a power value of reflected wave power at the output end of the first power supply calculated in the second power supply ON period is minimum within the search range, the frequency shift or frequency shift gain for optimization within the search range is a frequency shift or a frequency shift gain in which an average value of absolute values of differences between an average value of the reflection coefficients or the load-side impedances at the output end of the first power supply acquired for frequency shifts to be searched for and instantaneous values of the reflection coefficients or the load-side impedances at the output end of the first power supply acquired for the frequency shifts to be searched for is minimum, or a frequency shift or a frequency shift gain in which a reflection coefficient absolute value or a power value of reflected wave power at the output end of the first power supply calculated in the second power supply ON period is minimum within the search range, and an offset frequency value for optimization within the search range is an offset frequency at which a difference between an average value of reflection coefficients or load-side impedances at the output end of the first power supply calculated in the second power supply ON period and an average value of reflection coefficients or load-side impedances at the output end of the first power supply calculated in the second power supply OFF period is minimum in a state where the initial phase for the optimization is set as an initial phase and the frequency shift or the frequency shift gain for the optimization is set.

[Second Another Aspect]

A second another aspect according to the first another aspect, wherein the high-frequency power supply system further includes a second matcher that is connected between the second power supply and the load and performs a second matching operation of matching an impedance on a second power supply side with an impedance on the load side.

[Third Another Aspect]

A third another aspect according to the first or second another aspect, wherein the method further includes: causing the first matcher to perform a matching operation after the searching for the offset frequency is performed.

[Fourth Another Aspect]

A fourth another aspect is a method of controlling a high-frequency power supply system, wherein the high-frequency power supply system includes:

a second power supply that is capable of outputting a second forward wave voltage having a second fundamental frequency lower than a predetermined first fundamental frequency, and performs pulse modulation of repeating an ON operation of outputting the second forward wave voltage and an OFF operation of not outputting the second forward wave voltage, a first power supply that is capable of outputting a first forward wave voltage having the first fundamental frequency, and performs frequency modulation control to frequency-modulate the first forward wave voltage with a modulation signal having a same frequency as the second fundamental frequency in a second power supply ON period in which the ON operation is performed, and performs frequency offset control to output a third forward wave voltage having a third fundamental frequency obtained by adding an offset frequency to the first fundamental frequency in a second power supply OFF period in which the OFF operation is performed, and a first matcher that is connected between the first power supply and a load and performs a first matching operation of matching an impedance on a first power supply side with an impedance on a load side, the method includes:

causing the first matcher to perform the first matching operation after power supply from the first power supply and the second power supply to the load is started, and stopping the first matching operation when the first matching operation is completed;

searching for an initial phase of the modulation signal in which a reflection coefficient or load-side impedance at an output end of the first power supply calculated in the second power supply ON period is optimum within a search range in a state where the first matching operation in the first matcher is stopped;

searching for a frequency shift or a frequency shift gain in which the reflection coefficient or load-side impedance at the output end of the first power supply calculated in the second power supply ON period is optimum within the search range in a state where the first matching operation in the first matcher is stopped; and searching for an offset frequency at which the reflection coefficient or load-side impedance at the output end of the first power supply calculated in the second power supply OFF period is optimum within the search range in a state where the first matching operation in the first matcher is stopped, the initial phase of the modulation signal for optimization within the search range is an initial phase in which an average value of absolute values of differences between an average value of reflection coefficients or load-side impedances at the output end of the first power supply acquired for initial phases to be searched for and instantaneous values of the reflection coefficients or load-side impedances at the output end of the first power supply acquired for the initial phases to be searched for is minimum, the frequency shift or frequency shift gain for optimization within the search range is a frequency shift or a frequency shift gain in which an average value of absolute values of differences between an average value of reflection coefficients or load-side impedances at the output end of the first power supply acquired for frequency shifts to be searched for and instantaneous values of the reflection coefficients or load-side impedances at the output end of the first power supply acquired for the frequency shifts to be searched for is minimum, and an offset frequency value for optimization within the search range is an offset frequency at which a difference between an average value of reflection coefficients or load-side impedances at the output end of the first power supply calculated in the second power supply ON period and an average value of reflection coefficients or load-side impedances at the output end of the first power supply calculated in the second power supply OFF period is minimum in a state where the initial phase for the optimization is set as an initial phase and the frequency shift or frequency shift gain for the optimization is set.

[Fifth Another Aspect]

A fifth another aspect according to the fourth another aspect, wherein the high-frequency power supply system further includes a second matcher connected between the second power supply and the load and performing a second matching operation of matching an impedance on a second power supply side with an impedance on the load side.

[Sixth Another Aspect]

A sixth another aspect according to the fourth or fifth another aspect, further including:

causing the first matcher to perform a matching operation after the process of searching for an offset frequency.

[Seventh Another Aspect]

Seventh another aspect is a method of controlling a high-frequency power supply system, wherein the high-frequency power supply system includes:

a second power supply that is capable of outputting a second forward wave voltage having a second fundamental frequency lower than a predetermined first fundamental frequency, and performs pulse modulation of repeating an ON operation of outputting the second forward wave voltage and an OFF operation of not outputting the second forward wave voltage, a first power supply that is capable of outputting a first forward wave voltage having the first fundamental frequency, and performs frequency modulation control to frequency-modulate the first forward wave voltage with a modulation signal having a same frequency as the second fundamental frequency in a second power supply ON period in which the ON operation is performed, and performs frequency offset control to output a third forward wave voltage having a third fundamental frequency obtained by adding an offset frequency to the first fundamental frequency in a second power supply OFF period in which the OFF operation is performed, and a first matcher that is connected between the first power supply and a load and performs a first matching operation of matching an impedance on a first power supply side with an impedance on a load side, the method includes:

causing the first matcher to perform the first matching operation after power supply from the first power supply and the second power supply to the load is started, and stopping the first matching operation when the first matching operation is completed;

searching for an initial phase of the modulation signal in which a reflection coefficient absolute value or a power value of reflected wave power at an output end of the first power supply calculated in the second power supply ON period is minimum within a search range in a state where the first matching operation in the first matcher is stopped;

searching for a frequency shift or a frequency shift gain in which the reflection coefficient or load-side impedance at the output end of the first power supply calculated in the second power supply ON period is optimum within the search range in a state where the first matching operation in the first matcher is stopped; and searching for an offset frequency at which the reflection coefficient or load-side impedance at the output end of the first power supply calculated in the second power supply OFF period is optimum within the search range in a state where the first matching operation in the first matcher is stopped, the frequency shift or frequency shift gain for optimization within the search range is a frequency shift or a frequency shift gain in which an average value of absolute values of differences between an average value of reflection coefficients or load-side impedances at the output end of the first power supply acquired for frequency shifts to be searched for and instantaneous values of the reflection coefficients or load-side impedances at the output end of the first power supply acquired for the frequency shifts to be searched for is minimum, and an offset frequency value for optimization within the search range is an offset frequency at which a difference between an average value of reflection coefficients or load-side impedances at the output end of the first power supply calculated in the second power supply ON period and an average value of reflection coefficients or load-side impedances at the output end of the first power supply calculated in the second power supply OFF period is minimum in a state where the initial phase for the minimum is set as an initial phase and the frequency shift or frequency shift gain for the optimization is set.

[Eighth Another Aspect]

An eighth another aspect according to the seventh another aspect, wherein the high-frequency power supply system further includes a second matcher connected between the second power supply and the load and performing a second matching operation of matching an impedance on a second power supply side with an impedance on the load side.

[Ninth Another Aspect]

A ninth another aspect according to the seventh or eighth another aspect, further including:

causing the first matcher to perform a matching operation after the process of searching for an offset frequency.

[Tenth Another Aspect]

A tenth another aspect is a method of controlling a high-frequency power supply system, wherein the high-frequency power supply system includes:

a second power supply that is capable of outputting a second forward wave voltage having a second fundamental frequency lower than a predetermined first fundamental frequency, and performs pulse modulation of repeating an ON operation of outputting the second forward wave voltage and an OFF operation of not outputting the second forward wave voltage, a first power supply that is capable of outputting a first forward wave voltage having the first fundamental frequency, and performs frequency modulation control to frequency-modulate the first forward wave voltage with a modulation signal having a same frequency as the second fundamental frequency in a second power supply ON period in which the ON operation is performed, and performs frequency offset control to output a third forward wave voltage having a third fundamental frequency obtained by adding an offset frequency to the first fundamental frequency in a second power supply OFF period in which the OFF operation is performed, and a first matcher that is connected between the first power supply and a load and performs a first matching operation of matching an impedance on a first power supply side with an impedance on a load side, the method includes:

causing the first matcher to perform the first matching operation after power supply from the first power supply and the second power supply to the load is started, and stopping the first matching operation when the first matching operation is completed;

searching for an initial phase of the modulation signal in which a reflection coefficient or load-side impedance at an output end of the first power supply calculated in the second power supply ON period is optimum within a search range in a state where the first matching operation in the first matcher is stopped;

searching for a frequency shift or a frequency shift gain in which a reflection coefficient absolute value or a power value of reflected wave power at the output end of the first power supply calculated in the second power supply ON period is minimum within the search range in a state where the first matching operation in the first matcher is stopped; and searching for an offset frequency at which the reflection coefficient or load-side impedance at the output end of the first power supply calculated in the second power supply OFF period is optimum within the search range in a state where the first matching operation in the first matcher is stopped, the initial phase of the modulation signal for optimization within the search range is an initial phase in which an average value of absolute values of differences between an average value of reflection coefficients or load-side impedances at the output end of the first power supply acquired for initial phases to be searched for and instantaneous values of the reflection coefficients or load-side impedances at the output end of the first power supply acquired for the initial phases to be searched for is minimum, and an offset frequency value for optimization within the search range is an offset frequency at which a difference between an average value of reflection coefficients or load-side impedances at the output end of the first power supply calculated in the second power supply ON period and an average value of reflection coefficients or load-side impedances at the output end of the first power supply calculated in the second power supply OFF period is minimum in a state where the initial phase for the optimization is set as an initial phase and the frequency shift or frequency shift gain for the minimum is set.

[Eleventh Another Aspect]

An eleventh another aspect according to the tenth another aspect, wherein the high-frequency power supply system further includes a second matcher connected between the second power supply and the load and performing a second matching operation of matching an impedance on a second power supply side with an impedance on the load side.

[Twelfth Another Aspect]

A twelfth another aspect according to the tenth or eleventh another aspect, further including:

causing the first matcher to perform a matching operation after the process of searching for an offset frequency.

[Thirteenth Another Aspect]

A thirteenth another aspect is a method of controlling a high-frequency power supply system, wherein the high-frequency power supply system includes:

a second power supply that is capable of outputting a second forward wave voltage having a second fundamental frequency lower than a predetermined first fundamental frequency, and performs pulse modulation of repeating an ON operation of outputting the second forward wave voltage and an OFF operation of not outputting the second forward wave voltage, a first power supply that is capable of outputting a first forward wave voltage having the first fundamental frequency, and performs frequency modulation control to frequency-modulate the first forward wave voltage with a modulation signal having a same frequency as the second fundamental frequency in a second power supply ON period in which the ON operation is performed, and performs frequency offset control to output a third forward wave voltage having a third fundamental frequency obtained by adding an offset frequency to the first fundamental frequency in a second power supply OFF period in which the OFF operation is performed, and a first matcher that is connected between the first power supply and a load and performs a first matching operation of matching an impedance on a first power supply side with an impedance on a load side, the method includes:

causing the first matcher to perform the first matching operation after power supply from the first power supply and the second power supply to the load is started, and stopping the first matching operation when the first matching operation is completed;

searching for an initial phase of the modulation signal in which a reflection coefficient absolute value or a power value of reflected wave power at an output end of the first power supply calculated in the second power supply ON period is minimum within a search range in a state where the first matching operation in the first matcher is stopped;

searching for a frequency shift or a frequency shift gain in which a reflection coefficient absolute value or a power value of reflected wave power at the output end of the first power supply calculated in the second power supply ON period is minimum within the search range in a state where the first matching operation in the first matcher is stopped; and searching for an offset frequency at which the reflection coefficient or load-side impedance at the output end of the first power supply calculated in the second power supply OFF period is optimum within the search range in a state where the first matching operation in the first matcher is stopped, an offset frequency value for optimization within the search range is an offset frequency at which a difference between an average value of reflection coefficients or load-side impedances at the output end of the first power supply calculated in the second power supply ON period and an average value of reflection coefficients or load-side impedances at the output end of the first power supply calculated in the second power supply OFF period is minimum in a state where the initial phase for the minimum is set as an initial phase and the frequency shift or frequency shift gain for the minimum is set.

[Fourteenth Another Aspect]

A fourteenth another aspect according to the thirteenth another aspect, wherein the high-frequency power supply system further includes a second matcher connected between the second power supply and the load and performing a second matching operation of matching an impedance on a second power supply side with an impedance on the load side.

[Fifteenth Another Aspect]

A fifteenth another aspect according to the thirteenth or fourteenth another aspect, further including:

causing the first matcher to perform a matching operation after the process of searching for an offset frequency.

With the high-frequency power supply system according to any of the other aspects described above, the power value of the reflected wave power on the first power supply side can be reduced in both periods: the second power supply ON period and the second power supply OFF period. That is, the absolute value of the reflection coefficient on the first power supply side can be reduced.

What is claimed is:

1. A method of controlling a high-frequency power supply system, the high-frequency power supply system including:

a second power supply that is capable of outputting a second forward wave voltage having a second fundamental frequency lower than a predetermined first fundamental frequency, and performs pulse modulation of repeating an ON operation of outputting the second forward wave voltage and an OFF operation of not outputting the second forward wave voltage;

a first power supply that is capable of outputting a first forward wave voltage having the first fundamental frequency, and performs frequency modulation control to frequency-modulate the first forward wave voltage with a modulation signal having a same frequency as the second fundamental frequency in a second power supply ON period in which the ON operation is performed, and performs frequency offset control to output a third forward wave voltage having a third fundamental frequency obtained by adding an offset frequency to the first fundamental frequency in a second power supply OFF period in which the OFF operation is performed; and a first matcher that is connected between the first power supply and a load and performs a first matching operation of matching an impedance on a first power supply side with an impedance on a load side, the method comprising:

causing the first matcher to perform the first matching operation after power supply from the first power supply and the second power supply to the load is started, and stopping the first matching operation when the first matching operation is completed;

searching for an initial phase of the modulation signal in which a reflection coefficient or load-side impedance at an output end of the first power supply calculated in the second power supply ON period is optimum within a search range in a state where the first matching operation in the first matcher is stopped;

searching for a frequency shift or a frequency shift gain in which the reflection coefficient or the load-side impedance at the output end of the first power supply calculated in the second power supply ON period is optimum within the search range in the state where the first matching operation in the first matcher is stopped; and searching for an offset frequency at which a reflection coefficient or load-side impedance at the output end of the first power supply calculated in the second power supply OFF period is optimum within the search range in the state where the first matching operation in the first matcher is stopped, wherein the initial phase of the modulation signal for optimization within the search range is an initial phase in which an average value of absolute values of differences between an average value of reflection coefficients or load-side impedances at the output end of the first power supply acquired for initial phases to be searched for and instantaneous values of the reflection coefficients or the load-side impedances at the output end of the first power supply acquired for the initial phases to be searched for is minimum, or an initial phase of the modulation signal in which a reflection coefficient absolute value or a power value of reflected wave power at the output end of the first power supply calculated in the second power supply ON period is minimum within the search range, the frequency shift or frequency shift gain for optimization within the search range is a frequency shift or a frequency shift gain in which an average value of absolute values of differences between an average value of the reflection coefficients or the load-side impedances at the output end of the first power supply acquired for frequency shifts to be searched for and instantaneous values of the reflection coefficients or the load-side impedances at the output end of the first power supply acquired for the frequency shifts to be searched for is minimum, or a frequency shift or a frequency shift gain in which a reflection coefficient absolute value or a power value of reflected wave power at the output end of the first power supply calculated in the second power supply ON period is minimum within the search range, and an offset frequency value for optimization within the search range is an offset frequency at which a difference between an average value of reflection coefficients or load-side impedances at the output end of the first power supply calculated in the second power supply ON period and an average value of reflection coefficients or load-side impedances at the output end of the first power supply calculated in the second power supply OFF period is minimum in a state where the initial phase for the optimization is set as an initial phase and the frequency shift or the frequency shift gain for the optimization is set.

2. The method of controlling the high-frequency power supply system according to claim 1, wherein the high-frequency power supply system further includes a second matcher that is connected between the second power supply and the load and performs a second matching operation of matching an impedance on a second power supply side with an impedance on the load side.

3. The method of controlling the high-frequency power supply system according to claim 1, the method further comprising:

causing the first matcher to perform a matching operation after the searching for the offset frequency is performed.

4. The method of controlling the high-frequency power supply system according to claim 2, the method further comprising:

causing the first matcher to perform a matching operation after the searching for the offset frequency is performed.

* * * * *